United States Patent
Kim et al.

(10) Patent No.: US 7,829,834 B2
(45) Date of Patent: Nov. 9, 2010

(54) LOW-VOLTAGE IMAGE SENSOR HAVING MULTIPLE GATES BETWEEN A PHOTODIODE AND A DIFFUSION NODE FOR SUPPRESSING DARK CURRENT AND METHOD OF DRIVING TRANSFER TRANSISTOR THEREOF

(75) Inventors: Mi Jin Kim, Daejeon (KR); Bong Ki Mheen, Daejeon (KR); Young Joo Song, Daejeon (KR); Seong Su Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 333 days.

(21) Appl. No.: 11/875,513

(22) Filed: Oct. 19, 2007

(65) Prior Publication Data

US 2008/0099807 A1   May 1, 2008

(30) Foreign Application Priority Data

Oct. 20, 2006   (KR) .................. 10-2006-0102423
Mar. 8, 2007    (KR) .................. 10-2007-0022980

(51) Int. Cl.
*H01L 27/00* (2006.01)
*H01J 40/14* (2006.01)
*H04N 3/14* (2006.01)

(52) U.S. Cl. .................. 250/208.1; 250/214 R; 348/308

(58) Field of Classification Search .............. 250/208.1, 250/214 R; 348/308
See application file for complete search history.

(56) References Cited

U.S. PATENT DOCUMENTS 6,456,326 B2   9/2002   Fossum et al.

2006/0138581 A1 * 6/2006 Ladd .................. 257/462
2008/0012975 A1 * 1/2008 Sato et al. .................. 348/296

FOREIGN PATENT DOCUMENTS

| JP | 04125965 A * | 4/1992 |
| JP | 2002-064751 A | 2/2002 |
| KR | 1020010086511 | 9/2001 |
| KR | 1020020012928 | 2/2002 |
| KR | 1020030009625 | 2/2003 |

(Continued)

OTHER PUBLICATIONS

KIPO Notice of Patent Grant dated May 28, 2008 for the corresponding application KR 10-2007-0022980.

*Primary Examiner*—Thanh X Luu
(74) *Attorney, Agent, or Firm*—Ladas & Parry LLP

(57) ABSTRACT

Provided are a low-voltage image sensor and a method of driving a transfer transistor thereof, which are obtained by changing the structure and driving method of a typical transfer transistor of a 4-transistor CMOS transistor, and can eliminate the influence of a voltage or physical structure of a diffusion node on a reset or transfer operation of a photodiode. The image sensor includes a light receiving device for detecting light and a signal conversion unit for reading photocharge generated by the light receiving device to an external circuit. The signal conversion unit includes a transfer transistor including at least two gate electrodes. When the photocharge is transferred to a channel of a transfer gate electrode disposed closest to a photodiode, a transfer gate electrode disposed adjacent to a diffusion node remains turned off.

31 Claims, 13 Drawing Sheets

FOREIGN PATENT DOCUMENTS

| | | |
|---|---|---|
| KR | 1020030059451 | 7/2003 |
| KR | 1020040038225 | 5/2004 |
| KR | 100591075 | 6/2006 |
| KR | 1020060077079 | 7/2006 |
| KR | 1020060084484 | 7/2006 |
| KR | 1020070076623 | 7/2007 |

* cited by examiner

LOW-VOLTAGE IMAGE SENSOR HAVING MULTIPLE GATES BETWEEN A PHOTODIODE AND A DIFFUSION NODE FOR SUPPRESSING DARK CURRENT AND METHOD OF DRIVING TRANSFER TRANSISTOR THEREOF

CROSS-REFERENCE TO RELATED APPLICATION

This application claims priority to and the benefit of Korean Patent Application No. 2006-102423, filed Oct. 20, 2006, and No. 2007-22980, filed Mar. 8, 2007, the disclosure of which is incorporated herein by reference in its entirety.

BACKGROUND

1. Field of the Invention

The present invention relates to an image sensor and a method of driving the same and, more specifically, to an image sensor and a method of driving a transfer transistor of the image sensor to reset a photodiode and transfer charge in the photodiode.

The present invention has been produced from the work supported by the IT R&D program of MIC (Ministry of Information and Communication)/IITA (Institute for Information Technology Advancement) [2005-S-017-02, Integrated Development of UltraLow Power RF/HW/SW SoC] in Korea.

2. Discussion of Related Art

Image sensors may be largely divided into charge-coupled device (CCD) image sensors and complementary metal oxide semiconductor (CMOS) image sensors. Both the CCD image sensor and the CMOS image sensor use electron-hole pairs generated by light having a greater energy than the bandgap energy of silicon. Conventionally, the CCD and CMOS image sensors utilize a technique of estimating the quantity of irradiated light by collecting electrons or holes.

Like other CMOS devices, a CMOS image sensor includes a photodiode and a transistor disposed in each photosensitive pixel so that the CMOS image sensor can be fabricated using a conventional CMOS semiconductor fabrication process. Thus, as compared with a CCD image sensor in which an image signal processor should be disposed in an additional chip, the CMOS image sensor can integrate an image signal processor and an image detector into a circuit block disposed outside a pixel, operate at low voltage, and be fabricated at low production cost.

Conventionally, CMOS image sensors may be classified into a 4-transistor pixel structure and a 3-transistor pixel structure according to the number of transistors that form a single photosensitive pixel. Although the 3-transistor pixel structure is advantageous in terms of the fill factor and production cost, the 4-transistor pixel structure is widely used because the 4-transistor pixel structure separates a light receiving device from a detection unit, and the light receiving device is formed of a silicon bulk except for the surface thereof so that the 4-transistor pixel structure is highly responsive to light and resistant to dark current and noise.

A conventional 4-transistor pixel structure is illustrated in FIG. 1. The 4-transistor pixel structure includes four transistors. Specifically, a photodiode (PD) functioning as a light sensor and four NMOS transistors constitute a unit photosensitive pixel. The four NMOS transistors include a transfer transistor Tx, a reset transistor Rx, a drive transistor Dx, and a switch transistor Sx. The transfer transistor Tx functions to transfer photocharge generated by the photodiode PD to a diffusion node region FD, the reset transistor Rx functions to emit charge stored in the diffusion node region FD or the photodiode PD to detect signals, the drive transistor Dx functions as a source follower transistor, and the switch transistor Sx functions to perform switching/addressing operations.

The photodiode PD and a capacitor 118, which are connected in parallel, constitute a light receiving device, and the transfer transistor Tx transfers electrons generated due to photons to a diffusion node 131. In order to obtain a 2-dimensional image, an electric potential is applied through a gate 141 of the switch transistor Sx to select a column. In particular, each photosensitive pixel is biased by a current source 150. The current source 150 drives the drive transistor Dx and the switch transistor Sx to read the electric potential of the diffusion node 131 from an output node 142.

FIG. 2A is a cross-sectional view of a photodiode and a transfer transistor of a conventional 4-transistor CMOS image sensor.

Referring to FIG. 2A, an n-doping region 202 having a predetermined concentration and a p+ region 203 functioning as a surface pinning region are disposed on a p-type substrate 201 and constitute a photodiode, which is a light receiving device. A gate insulating layer 205, a gate electrode material 206, a control line 210, and a sidewall insulating layer 207 are disposed on the surface 201 and constitute a transfer transistor. The transfer transistor is used to reset the n-doping region 202 in which photocharge is generated and accumulated and to transfer the photocharge. In this case, diffusion nodes 204(a) and 204(b), which serve to convert photocharge into a voltage, include a diffusion region 204(a) that is doped with n-type impurities before forming the sidewall insulating layer 207, so that the diffusion nodes 204(a) and 204(b) can be self-aligned with the gate electrode material 206 of the transfer transistor.

FIG. 2B is a signal waveform diagram illustrating methods of driving a transfer transistor and a reset transistor to transfer photocharge generated by a photodiode and reset the photodiode in a conventional 4-transistor image sensor. Typically, a power supply voltage Vdd is used as a turn-on voltage of each of a transfer transistor and a reset transistor, and a ground voltage is used as a turn-off voltage thereof. When a reset transistor Rx is turned on (refer to 231), low impedance is maintained between the photodiode and a drain of the reset transistor Rx during a turn-on period 232 of a transfer transistor Tx, so that charge accumulated in the photodiode is emitted out of a photosensitive pixel to reset the photodiode. After resetting the photodiode, a diffusion node is reset during a turn-on period 235 of the reset transistor Rx and thus, a voltage of the diffusion node is pinned to a voltage obtained by subtracting a threshold voltage Vth of the reset transistor Rx from the power supply voltage Vdd. After the reset period 232 of the photodiode, the photodiode receives light. Thus, photocharge, which is accumulated in the photodiode during generation/accumulation period of photocharge, i.e., an integration time 236, is transferred to a diffusion node constituting a source follower and finally converted into a voltage at an external circuit when the transfer transistor Tx is turned on (refer to 233). In this case, the intensity of light is detected due to a drop in the voltage of the diffusion node read from an output node after the period 233 for transferring the photocharge on the basis of the voltage of the diffusion node read from the output node after the period 235 for resetting the diffusion node.

Therefore, in operation of the 4-transistor pixel CMOS image sensor, photo-generated carriers accumulated in the photodiode after the reset period 232 of the photodiode are transferred to a floating diffusion node so that the amount of the photo-generated carriers is detected due to a drop in the voltage of the diffusion node. Therefore, it is necessary for the transfer transistor to perform constant and uniform reset and transfer operations in order to precisely and uniformly detect the amount of the accumulated photo-generated carriers. A conventional 4-transistor pixel CMOS image sensor includes various photodiodes, such as a complete-reset pinned photodiode, so that the transfer transistor performs constant reset and transfer operations. When the complete-reset pinned photodiode is reset, all mobile charge in the photo diode is completely depleted so that no variation in electric potential occurs. In this case, the electric potential of the photodiode may be always pinned to a constant value irrespective of external bias environment such as the electric potential of the floating diffusion node. Thus, the transfer transistor can always perform the reset and transfer operations under uniform and equal conditions.

However, in recent years, the electric potential of a diffusion node has been increasingly lowered in order to downscale semiconductor devices and reduce power consumption. Due to a reduction in the electric potential of the diffusion node, the pinning electric potential of a complete-reset pinned photodiode is naturally dropped. In this case, however, pixel characteristics, such as well capacity and the responsivity of a photodiode to light, may worsen and fixed pattern noise may increase. As a result, even if an operating voltage is reduced, there is a limit to dropping the pinning electric potential of the pinned photodiode.

In a typical pixel driving condition where the power supply voltage Vdd is equal to a turn-on voltage, the conditions under which the photodiode performs reset and transfer operations are changed. In order to reset the photodiode, when a reset transistor is turned on, the voltage of the diffusion node is pinned to a difference Vdd-Vth between the power supply voltage Vdd and the threshold voltage Vth of the reset transistor. Since a channel of the reset transistor has about the same dopant concentration as a channel of the transfer transistor, when the transfer transistor is turned on, a voltage difference between the gate electrode of the transfer transistor and the diffusion node becomes the threshold voltage Vth so that the diffusion node may operate under boundary conditions between pinch-off conditions and linear conditions. Thus, the gate voltage of the transfer transistor may be applied and electrons may be instantaneously emitted from the diffusion node to the channel of the transfer transistor, thereby greatly affecting the reset and transfer conditions of the photodiode. Also, the influence of the diffusion node is very sensitive to process variables (Bongki Mheen, et. al., "Operation Principles of 0.18-μm Four-Transistor CMOS Image Pixels With a Nonfully Depleted Pinned Photodiode," IEEE Trans. Electron Devices, vol. 53, no. 11, 2006).

During the reset and transfer operations of the photodiode, the moment a turn-on voltage is applied to the transfer transistor, a region disposed under a gate of the transfer transistor becomes a deep depletion region irrespective of the physical magnitude of the gate of the transfer transistor or the operating voltage. The instantaneous deep depletion region formed under the transfer transistor induces more charge to be emitted from the diffusion node toward the channel of the transfer transistor than when the channel of the transfer channel is in a state of stable equilibrium. In other words, even more charge may be emitted from the diffusion node than when the channel of the transfer transistor is in the state of stable equilibrium, and the amount of charge emitted from the diffusion node may be affected by a method for applying a voltage or the physical structure of the transfer transistor.

Also, the influence of the diffusion node may depend on whether the photodiode undergoes a reset operation or a transfer operation. After resetting the photodiode, the diffusion node is floated. Unlike when the photodiode is reset, the voltage of the floating diffusion node is pinned to a voltage obtained by subtracting the threshold voltage of the reset transistor and a voltage due to a clock feedthrough effect caused by the turn-off of the reset transistor from the power supply voltage. Also, the voltage of the floating diffusion node becomes closer to linear conditions than when the photodiode is reset. However, as the voltage of the transfer transistor rises due to a coupling capacitance present between the transfer transistor and the floating diffusion node, the voltage of the floating diffusion node also rises. Furthermore, since the instantaneous emission of electrons to the channel of the transfer transistor affects the voltage of the floating diffusion node again, the extent of the influence of the diffusion node depends on whether the photodiode performs the reset operation or the transfer operation (Bongki Mheen, et. al., "Operation Principles of 0.18-μm Four-Transistor CMOS Image Pixels With a Nonfully Depleted Pinned Photodiode," IEEE Trans. Electron Devices, vol. 53, no. 11, 2006).

In a conventional case where a higher voltage than a pinning voltage is used as an operating voltage, a photodiode is more fully reset so that reset and transfer operations of the photodiode may be hardly affected by a diffusion node. As a result, the influence of the diffusion node on reset and transfer conditions of the photodiode can be excluded. However, although the operating voltage is sharply reduced due to the downscaling of the semiconductor devices and low-voltage operation conditions, the threshold voltage of the transistor cannot be dropped below the limit. Thus, during the reset and transfer operations of the photo diode, the pinning electric potential of the photodiode should drop more sharply in order to prevent charge from flowing from the photodiode to the channel in a subthreshold region (i.e., in order to completely deplete the photodiode in a short amount of time). Even if the pinning electric potential of the photodiode is lowered by sacrificing light responsivity or well capacity, since the influence of the diffusion node on the photodiode depends on whether the photodiode performs the reset operation or the transfer operation, the pinning electric potential of the photodiode should be reduced still more in order to pin the photodiode at a constant voltage level. Furthermore, because the influences of process variables and drive methods need to be considered, it becomes more difficult to determine the pinning voltage or physical structure of the photodiode.

Also, a predetermined potential barrier is present between the transfer transistor and the pinned photodiode on which a p-type doping layer serving as a surface pinning layer is formed. In order to eliminate the influence of the potential barrier on the reset or transfer operation of the photodiode, the pinning electric potential of the photodiode, the electric potential of the floating diffusion node, and the turn-on electric potential of the transfer transistor should be sufficiently different. When the potential barrier is not sufficiently reduced, even if the pinning voltage of the photodiode is very low, the photodiode is not completely reset and the amount of charge remaining in the photodiode during the reset and transfer operations is determined by the potential barrier, thereby causing serious problems. Specifically, as the operating voltage is reduced, a difference between the pinning electric potential of the photodiode and the electric potential of the floating diffusion node is also reduced, it is strongly likely that well capacity will be generally lowered and the photodiode will be incompletely reset, and the influence of the diffusion node becomes very sensitive to process variables.

In order to overcome the above-described drawbacks, several conventional methods have been proposed. First, a voltage applied from a floating diffusion node to a gate of a reset transistor Rx may be forcibly boosted from a general electric potential VDD-VTH to a power supply voltage VDD using a voltage boosting circuit. Second, a PMOS transistor may be used as a reset transistor Rx instead of a conventional NMOS transistor so that the electric potential of a floating diffusion node can be boosted to a power supply voltage VDD.

However, when using the voltage boosting circuit, a higher voltage than a typical operating voltage is applied to the gate of the reset transistor Rx so that the reliability of a gate oxide may deteriorate. Also, when the PMOS transistor is used as the reset transistor Rx, the PMOS transistor occupies a larger area than the NMOS transistor so that the fill factor is reduced to degrade the characteristics of the reset transistor Rx. Furthermore, it is known that the PMOS transistor doubles the noise of the NMOS transistor.

In addition, the above-described approaches do not fundamentally solve the problems caused by a low operating voltage, but they are just aimed at elevating efficiency at the same operating voltage.

Therefore, various methods have conventionally been disclosed to solve the foregoing problems. For example, in Korean Patent Registration No. 10-059175 entitled "Active Pixel Sensor Using Transmission Transistor Having Coupled Gate", two transfer transistors may be included so that after one transfer transistor adjacent to a photodiode is turned off and floated, another transfer transistor is turned on to boost a voltage using coupling capacity. In another method, a voltage applied to a gate of a transfer transistor may be boosted using a coupling capacitor obtained by forming a conductive layer on a transfer transistor Tx by interposing an insulating layer therebetween. Furthermore, Korean Patent Laid-open Publication No. 10-2006-0084484 has introduced a method using an effect obtained by boosting a voltage of a diffusion node FD to as much as a coupling voltage by forming a coupling capacitor including a conductive layer formed on a drive transistor Dx by interposing an insulating layer therebetween.

However, the method of boosting a voltage using coupling capacity in the transfer transistor involves turning one transfer transistor off to float the photodiode and the transfer transistor. Thus, a voltage is applied again to a coupling capacitor so that the voltage is transmitted to a channel of the transfer transistor by as much as a ratio of coupling capacity to the entire capacity. Therefore, photocharge, which is emitted from the photodiode to the channel of the transfer transistor before boosting a gate voltage due to the coupling capacity, flow into a substrate or the photodiode during the boosting of the gate voltage, thereby degrading the transmission efficiency of the photocharge. Also, a voltage boosting effect is changed due to a time taken until the voltage is applied again to the coupling capacitor disposed on the transfer transistor after removing the voltage applied to the gate of the transfer transistor. Accordingly, the boosting effect may greatly depend on a method of applying a voltage or an immaterial time error. Moreover, the photodiode is reset under other conditions than when photocharge accumulated in the photodiode is transferred, thereby precluding generating constant dark current or sensing light having specific luminous intensity or less.

Above all, in the above-described method, a voltage applied to the transfer transistor is boosted in order to elevate the electric potential of the photodiode to a constant high electric potential in a short amount of time during the reset or transfer operation of the transfer transistor. However, while the voltage applied to the transfer transistor is being boosted, more electrons are emitted from the diffusion node to the channel of the transfer transistor during the reset or transfer operation of the photodiode. As a result, the emission of charge accumulated in the photodiode may be controlled. Also, the influence of the diffusion node on the emission of the charge accumulated in the photodiode may depend on whether the transfer transistor performs the reset operation or the transfer operation. Therefore, as a higher voltage is applied to the transfer transistor, the entire noise of an image sensor may increase.

SUMMARY OF THE INVENTION

The present invention is directed to an image sensor, which can suppress dark current and fixed pattern noise and improve a dynamic range at a low operating voltage, and a method of driving a transfer transistor thereof.

Also, the present invention is directed to an image sensor and a method of driving a transfer transistor thereof, which can lessen dependence on the structure or dopant concentration of a photodiode and the electric potential of a diffusion node, effectively control dark current and noise components, such as fixed pattern noise, and increase a dynamic range.

To achieve the above-described objects, the present invention provides an image sensor and a method of driving a transistor thereof, which can satisfy two contrary conditions, i.e., both a condition where a turn-on voltage of a gate electrode should be dropped to suppress the emission of charge from a diffusion node during reset and transfer operations of a photodiode, and a condition where a pinning voltage of the photodiode should be boosted and the turn-on voltage of the gate electrode should be boosted to improve a dynamic range.

In order to satisfy the two contrary conditions, the present invention provides a transfer transistor having multiple gate electrodes and a method of driving the same, which exclude the influence of a diffusion node using a gate electrode disposed adjacent to the diffusion node during the emission of charge from a photodiode and accelerate emission of charge using a gate electrode disposed adjacent to the photodiode.

Furthermore, even if the photodiode is incompletely reset to a pinning electric potential, a reset operation may be performed to the same extent as a transfer operation. In the case of a complete-reset photodiode that is completely reset to a pinning electric potential, a pinning voltage of the photodiode can be boosted at a specific operating voltage using a specific photodiode, and the influence of process variables may be minimized and/or process margins may be provided.

Also, the present invention provides an image sensor and a method of driving a transfer transistor thereof, which can effectively suppress dark current and noise components, such as fixed pattern noise, at low cost under low operating-voltage conditions.

One aspect of the present invention provides a method of driving a transfer transistor of an image sensor including a light receiving device for generating photocharge; and the transfer transistor for transferring the photocharge to a diffusion node and including at least two gate electrodes disposed in different positions between the light receiving device and the diffusion node. The method includes applying a turn-on voltage to a gate electrode disposed close to the light receiving device earlier than at least one of the other gate electrodes. Hereinafter, each multiple transfer gate electrode of the transfer transistor will be referred to as a gate electrode for brevity.

Another aspect of the present invention provides an image sensor including: a light receiving device for generating photocharge; and a transfer transistor for transferring the photocharge to a diffusion node. The transfer transistor includes: a photodiode (PD)-adjoining gate electrode disposed on a channel region adjacent to the light receiving device; a diffusion-node (FD)-adjoining gate electrode disposed on the channel region adjacent to the diffusion node; and an intermediate gate electrode interposed between the PD-adjoining gate electrode and the FD-adjoining gate electrode and electrically insulated from the PD-adjoining gate electrode and the FD-adjoining gate electrode.

Yet another aspect of the present invention provides an image sensor including: a light receiving device for generating photocharge; a transfer transistor for transferring the photocharge, the transfer transistor including a first gate electrode disposed on a channel region adjacent to the light receiving device and a second gate electrode disposed on the channel region adjacent to the diffusion node and electrically insulated from the first gate electrode; and a control unit for performing a method of driving a transfer transistor according to the first aspect of the present invention.

Still another aspect of the present invention provides an image sensor including: a light receiving device for generating photocharge; and a transfer transistor for transferring the photocharge to a diffusion node and including at least two gate electrodes. In the image sensor, the amount of charge of an equilibrium channel formed due to each of the gate electrodes is higher than the maximum amount of the photocharge accumulated in the light receiving device, so that a channel formed due to each of the gate electrodes operates in a deep depletion state during the emission of the photocharge from the light receiving device.

Here, a channel formed due to at least one gate electrode (e.g., a gate electrode disposed closest to the diffusion node) does not operate in a deep depletion state.

The image sensor according to the present invention may include a light receiving device, a signal conversion unit, which converts photocharge generated by the light receiving device into a voltage and applies the voltage, and a signal control unit, which controls the drive of the image sensor.

The light receiving device may not be limited to specific structures. The light receiving device may have a depletion region where photocharge is generated and accumulated. For example, the light receiving device may be a photodiode, a pinned photodiode, a phototransistor, or a photogate.

The signal conversion unit may convert the photocharge generated and accumulated in the light receiving device into a voltage and apply the voltage. The signal conversion unit may include a transfer transistor, a reset transistor, a drive transistor, and/or a switch transistor. According to the structure of the image sensor, the signal conversion unit may include a single transistor that functions as both a transfer transistor and a reset transistor.

The transfer transistor controls the transfer of photocharge generated and accumulated in the light receiving device to a diffusion node functioning as a charge storage region. The reset transistor eliminates signal charge from the diffusion node to initialize the diffusion node. The drive transistor is a source-follower transistor that has a gate electrically connected to the diffusion node and provides an electric potential corresponding to the photocharge transferred to the diffusion node. The switch transistor controls the application of the electric potential provided by the drive transistor.

The signal control unit may include a timing/control circuit for driving and controlling the signal conversion unit. Also, the signal control unit may include an electric potential controller for controlling turn-on and turn-off voltages of the transfer transistor, the reset transistor, the drive transistor and/or the switch transistor.

The image sensor according to the present invention may include a transfer transistor having multiple gate electrodes, which can electrically isolate the diffusion node during the emission of charge from the light receiving device, effectively suppress a potential barrier present between the light receiving device and the channel of the transfer transistor, facilitate the transfer of photocharge from the light receiving device to the diffusion node, and minimize the influence of process variables.

In the image sensor according to the present invention, the amount of charge of an equilibrium channel of each of the gate electrodes of the transfer transistor, or all the gate electrodes excepting a gate electrode disposed closest to the diffusion node, may be higher than the maximum amount of charge that can be accumulated in the photodiode. In this case, the amount of the charge of the equilibrium channel of each of the gate electrodes is determined by a turn-on voltage applied to the corresponding gate electrode, the length and width of the corresponding gate electrode, and the kind and thickness of a material of a gate insulating layer. Thus, a gate electrode disposed closest to the photodiode from among the multiple gate electrodes needs to operate in a deep depletion state to transfer charge from the photodiode.

That is, the transfer transistor of the image sensor according to the present invention includes multiple gate electrodes so that the emission of photocharge accumulated in the light receiving device can be separated from the transfer of the emitted photocharge to the diffusion node, to eliminate the influence of the diffusion node during the emission of the photocharge from the light receiving device. Also, a potential barrier present between the photodiode and the gate electrode of the transfer transistor can be effectively suppressed. As a result, the occurrence of dark current and fixed pattern noise can be reduced, the well capacity of the photodiode can be improved, and the dynamic range of the image sensor can be increased.

In comparison with the structure and driving method of a conventional image sensor including a photodiode, the effects of the structure and driving method of the image sensor according to the present invention will now be described. In a conventional transfer transistor having a single transfer gate electrode, when a turn-on voltage of the transfer transistor is set below the maximum operating voltage in order to exclude the influence of a diffusion node, the pinning voltage of a photodiode should be dropped and the dynamic range of the image sensor should be reduced.

However, when a voltage applied to the transfer transistor is elevated to increase the well capacity of the photodiode and the dynamic range of the image sensor, the emission of electrons from the diffusion node to the channel of the transfer transistor is accelerated during the reset or transfer operation of the photodiode, thereby suppressing the emission of charge accumulated in the photodiode. This influence of the diffusion node on the emission of the charge varies according to reset and transfer conditions. As a result, when a voltage applied to the transfer transistor becomes higher, dark current and fixed pattern noise may increase and the reset operation of the photodiode may be inefficient. Thus, even if a higher voltage is applied to the transfer transistor, the well capacity of the photodiode may decrease.

With a reduction in operating voltage, the above-described phenomenon becomes more serious. Thus, the performance of the image sensor may deteriorate and it becomes more difficult to design physical structures of the photodiode and the transfer transistor. Therefore, since it is effective to elevate the turn-on voltage of the transfer transistor as long as the influence of the diffusion node is eliminated, it is most desirable that the charge accumulated in the photodiode should be emitted at a high gate voltage while preventing the emission of charge from the diffusion node.

The present invention can satisfy the foregoing two contrary conditions. Thus, when charge is emitted from the photodiode, the influence of the diffusion node can be eliminated during the emission of the charge from the photodiode by use of the gate electrode disposed close to the diffusion node, the highest possible voltage is applied to the gate electrode disposed close to the photodiode, and a potential barrier present between the photodiode and the channel of the transfer transistor can be effectively suppressed using a deep depletion effect at a turn-on voltage of the transfer transistor.

The effects of the image sensor according to the fourth aspect of the present invention will now be described in more detail. The amount of the charge of the equilibrium channel, which is determined by the turn-on voltage of the gate electrode, the length and width of the gate electrode, and the material and thickness of the gate insulating layer, is higher than the maximum amount of photocharge that can be accumulated in the photodiode, so that the gate electrode can always operate using a deep depletion channel. Thus, when the light receiving device is a complete-depletion type, the pinning voltage of the light receiving device can be boosted and the influence of process variables can be lessened. Also, when the light receiving device is an incomplete-depletion type in which mobile charge remains in the photodiode after reset or transfer operation of the light receiving device, the amount of the mobile charge remaining in the light receiving device during the reset and transfer operations may be controlled to be constant, and a variation in the amount of the charge remaining in the light receiving device due to an increase in dark current and changes of process variables, an operating voltage, a method of applying the operating voltage, and the voltage of the diffusion node, may be minimized. Thus, the pinning voltage of the light receiving device may not be lowered, optical characteristics can be sustained, and the occurrence of dark current, fixed pattern noise, and image lag can be inhibited at a low operating voltage.

The most desirable structure and driving method of the image sensor according to the present invention will now be described. The image sensor includes a transfer transistor having multiple gate electrodes so that the diffusion node is electrically isolated during the emission of photocharge from the light receiving device to suppress instantaneous emission of charge from the diffusion node to the channel of the transfer transistor during the reset and transfer operations of the light receiving device.

Therefore, when a turn-on voltage is applied to the gate electrode disposed adjacent to the light receiving device during the reset and transfer operations of the light receiving device, a portion disposed under the gate electrode may be put into a deep depletion state so that the charge accumulated in the light receiving device is transferred to the channel. Thus, the channel may remain as an equilibrium channel or capture the photocharge in a slightly deep depletion state according to the amount of the photocharge transferred from the light receiving device to the channel. In this case, the amount of the charge of the equilibrium channel of each of the gate electrodes excepting the gate electrode disposed closest to the diffusion node may be higher than the maximum amount of charge that can be accumulated in the light receiving device during the emission of the photocharge from the light receiving device in order to exclude the influence of the method of applying a voltage to the gate electrode or an applied voltage maintaining time.

Thereafter, when a turn-on voltage is applied to the gate electrode disposed second closest to the light receiving device, photocharge present in the channel disposed under the gate electrode disposed closest to the light receiving device is redistributed according to the electric potential of a portion disposed under the gate insulating layer, and a turn-off voltage is applied to the gate electrode disposed closest to the light receiving device. Thus, the entire amount of the photocharge present in the channel is transferred to the channel of the gate electrode disposed second closest to the light receiving device.

As described above, when the turn-on voltage and the turn-off voltage are applied to the adjacent gate electrodes at a predetermined time interval, the agglomeration of photocharge is finally transferred to the channel disposed under the gate electrode of the transfer transistor disposed closest to the diffusion node. The gate electrode disposed closest to the diffusion node is enabled so that the photocharge is transferred to the diffusion node. When the turn-off voltage is applied to the gate electrode, the entire amount of signal charge is transferred to the diffusion node and thus, a signal voltage is amplified and output.

The suppression of the potential barrier present between the light receiving device and the channel of the transfer transistor is greatly affected by a voltage applied to the gate electrode disposed close to the light receiving device and a voltage application method.

In order to effectively suppress the potential barrier present between the light receiving device and the channel of the transfer transistor during the emission of the photocharge accumulated in the light receiving device, a time taken to apply a specific turn-on voltage to the gate electrode disposed closest to the light receiving device after the turn-off voltage is applied may include the shortest possible rising time that can be allowed by a voltage application circuit. In this case, a portion disposed under the gate electrode disposed closest to the light receiving device can be switched from an equilibrium state to a deep depletion state so that the electric potential of the deep depletion portion disposed under the gate electrode can be higher than the turn-on voltage applied to the gate electrode. Accordingly, when the light receiving device is a complete-depletion type, a time taken to perform reset or transfer operation can be shortened and the pinning voltage of the light receiving device can be boosted. Also, when the light receiving device is an incomplete-depletion type, more charge can be emitted from the light receiving device at the same turn-on voltage than in the conventional case, so that the dynamic range of the image sensor and the well capacity of the light receiving device can be increased.

The transfer of photocharge from the light receiving device through the channel of the gate electrode disposed close to the light receiving device to the diffusion node is greatly affected by a method of applying turn-off voltages to multiple gate electrodes of the transfer transistor. As a turn-on voltage and a turn-off voltage are applied to adjacent gate electrodes at predetermined time intervals, the agglomeration of photocharge is transferred from the light receiving device to the diffusion node.

More specifically, when a turn-on voltage is applied to a gate electrode disposed adjacent to a gate electrode in which signal charge is captured, the photocharge emitted from the light receiving device to the channel is redistributed according to the electric potential of the portion disposed under the gate electrodes to which the turn-on voltage is applied. When a turn-off voltage is applied to the gate electrode disposed closest to the light receiving device from among the gate electrodes to which the turn-on voltage is applied, signal charge captured under the turned-off gate electrode is transferred due to a lateral electric field parallel to the channel surface.

In this case, the signal charge captured due to a gate voltage may be transferred to a portion deviating from a signal charge transmission path, for example, a substrate, to induce the loss of signal charge or maybe to return to the light receiving device to cause dark current components or degradation, such as image lag. In order to prevent the foregoing problems, when a turn-off voltage is applied to the gate electrode, turn-on voltages should be applied to the gate electrode to which the turn-off voltage is applied and its adjacent gate electrode, and a falling time, which is taken to apply a turn-off voltage to a gate electrode after a turn-on voltage, is applied to the gate electrode. And, turn-on voltages should be as long as possible as long as the operating speed of the image sensor is not seriously degraded, so that the highest lateral electric field parallel to the channel surface can be provided toward the diffusion node during the transfer of the signal charge.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

Figure 1:
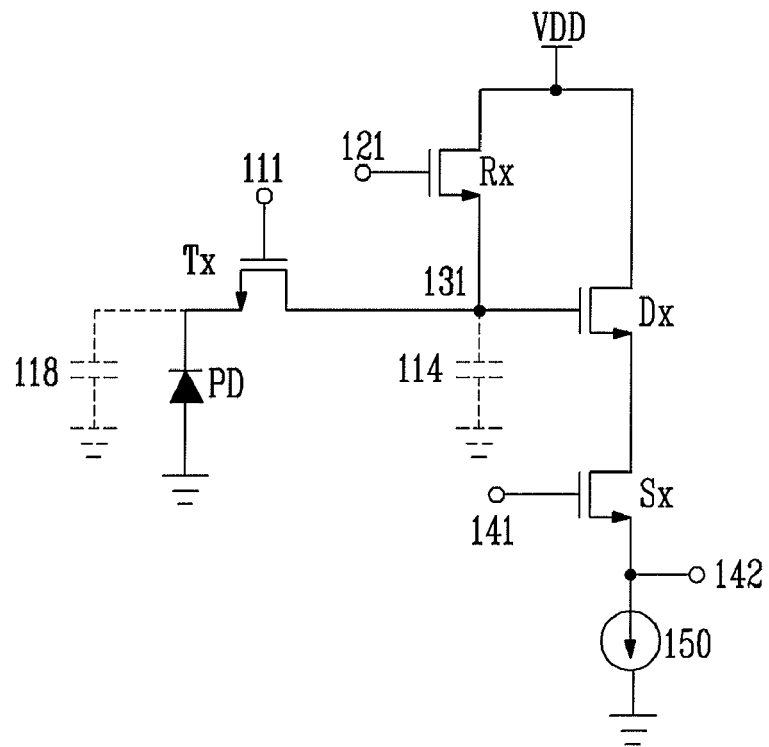
FIG. 1 is a circuit diagram of a conventional 4-transistor CMOS image sensor.

The present invention will now be described more fully hereinafter with reference to the accompanying drawings, in which exemplary embodiments of the invention are shown. This invention may, however, be embodied in different forms and should not be construed as limited to the embodiments set forth herein.

For example, the following embodiments will be described assuming that an image sensor according to the present invention is a 4-transistor CMOS image sensor including a pinned photodiode functioning as a light receiving device and a signal conversion unit including four transistors. However, it is clear that the image sensor according to the present invention can be applied to other image sensors, including other kinds of light receiving devices and transistors for transferring photocharge generated by the light receiving devices, for example, a CCD low-voltage output-terminal sensing circuit.

Also, a lower structure between a diffusion node and a gate electrode is simply illustrated in the drawings. However, an image sensor and a method of driving a transfer transistor thereof according to the present invention can obtain expected effects irrespective of the change in a material or forming process of a gate sidewall insulating layer, the change in the dopant concentration or structure of the diffusion node, the use or disuse of an expansion region, and the change in a process of forming a gate of a transfer transistor. Therefore, the structure of the transfer transistor and the requirements and driving conditions of the gate structure will be mainly described to attain the effects of the present invention using various structures and processes.

Further, the following embodiments will be described for brevity assuming that a multi-gate transfer transistor is a dual-gate transfer transistor or a triple-gate transfer transistor. However, the present invention is not limited thereto and a transfer transistor according to the present invention may include four or more gates, and the same structures and driving methods as in the following embodiments can be applied thereto without departing from the spirit and scope of the present invention.

In the drawings, it is illustrated that a substrate and a doping region disposed on a photodiode are doped with p-type impurities, and a diffusion node and the photodiode are doped with n-type impurities. However, the present invention is not limited thereto and the substrate and the doping region disposed on the photodiode may be doped with n-type impurities, and the diffusion node and the photodiode may be doped with p-type impurities.

In the cross-sectional views showing the structures of devices, like reference numerals are used to denote like elements. In the signal waveform diagrams showing the driving methods of the devices, like reference numerals and characters are used to denote similar driving methods.

Embodiment 1

In the present embodiment, a CMOS image sensor includes a photodiode, a photosensitive pixel including a transfer transistor for transferring photocharge generated by the photodiode to a diffusion node, and a drive/control circuit (hereinafter, a control unit) for controlling the voltage application times, voltage elimination times, voltage maintaining times, and applied voltages of multiple gate electrodes of the transfer transistor.

In the CMOS image sensor according to the present embodiment, the transfer transistor includes three transfer gate electrodes in order to eliminate the influence of the diffusion node on the electric potential of the photodiode during reset and transfer operations of the photodiode.

Figure 3A:
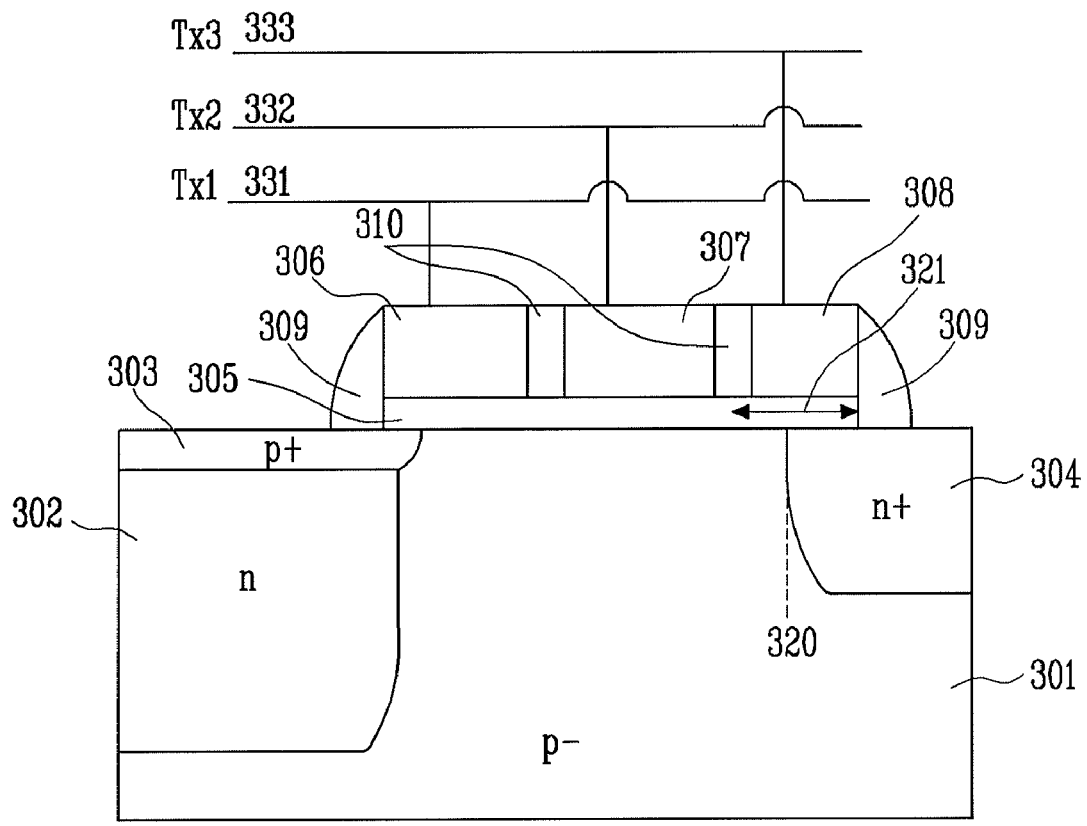
FIGS. 3A through 3C are cross-sectional views of photodiodes and transfer transistors of CMOS image sensors according to exemplary embodiments of the present invention.
Figure 3B:
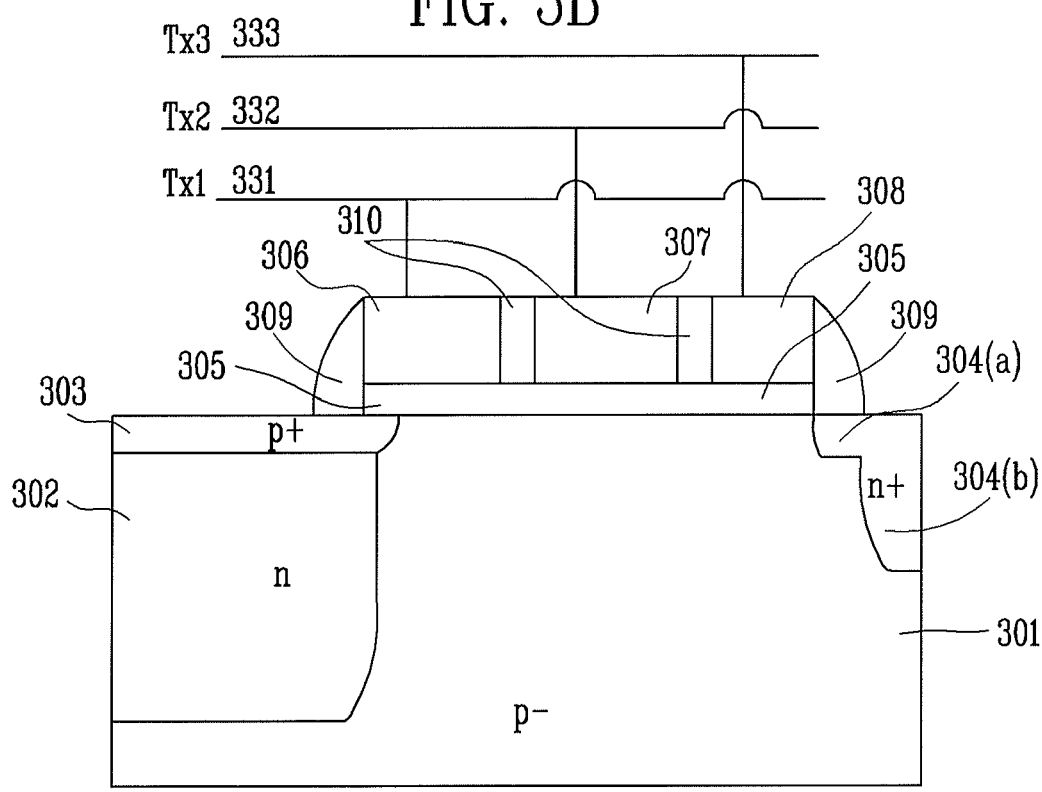
Figure 3C:
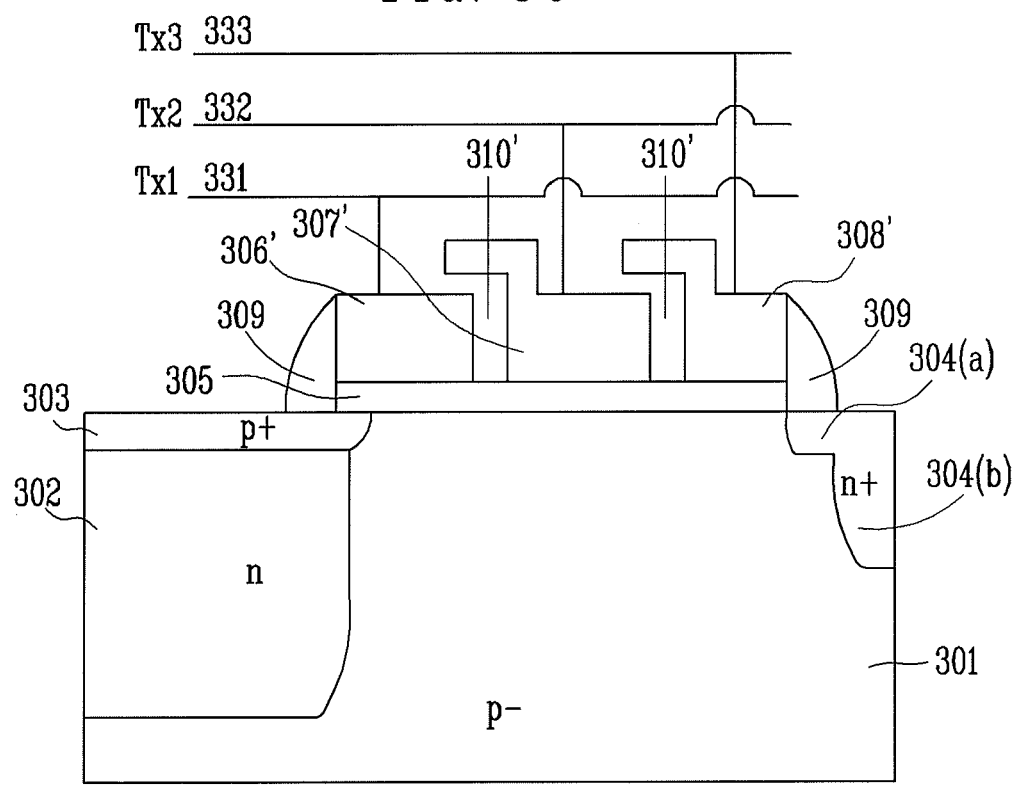

FIGS. 3A through 3C are cross-sectional views of photodiodes and transfer transistors of CMOS image sensors according to the current embodiment of the present invention.

FIG. 3A illustrates a photodiode 302 and 303, a transfer transistor, and a diffusion node 304 of a 4-transistor CMOS image sensor. The transfer transistor includes three gate electrodes 306, 307, and 308, which are electrically isolated from one another, a gate insulating layer 305, and a substrate 301, which is uniformly and lightly doped with p-type impurities.

The photodiode includes an n-type doping region 302, which senses light and accumulates photocharge, and a surface doping region 303, which is heavily doped with p+-type impurities.

Three transfer gate electrodes of the transfer transistor include the three gate electrodes 306, 307, and 308, an insulating material 310 for electrically isolating the gate electrodes 306, 307, and 308 from one another, and the gate insulating layer 305. Also, the three transfer gate electrodes are respectively controlled by voltages applied to control lines 331, 332, and 333, which are connected to the gate electrodes 306, 307, and 308, respectively.

From among the three transfer electrodes, reference character Tx1 denotes a PD-adjoining transfer gate electrode, which is formed on a channel region adjacent to the photodiode, Tx3 denotes an FD-adjoining transfer gate electrode, which is formed on the channel region adjacent to the diffusion node, and Tx2 denotes an intermediate transfer gate electrode, which is interposed between the PD-adjoining transfer gate electrode and the FD-adjoining transfer gate electrode and electrically insulated from the PD-adjoining gate transfer electrode and the FD-adjoining gate transfer electrode.

Hereinafter, the three transfer gate electrodes having the foregoing structures will be referred to as transfer gate electrodes Tx1, Tx2, and Tx3.

As described above, in the image sensor according to the present embodiment, each of the control lines 331, 332, and 333 may further include a circuit for controlling a time taken to apply a turn-on voltage or turn-off voltage and a time to maintain the application of the turn-on voltage or turn-off voltage, a switching device for allowing or cutting off the application of a voltage, and/or a control unit for controlling the turn-on voltage or turn-off voltage.

In FIG. 3A, the transfer gate electrode Tx1 is used to emit the photocharge accumulated in the photodiode to the substrate 301 disposed under the gate insulating layer 305. The transfer gate electrode Tx2 is used to capture signal charge under the gate insulating layer 305 and send a region between the diffusion node and the photodiode to a high-impedance state without the loss of the signal charge. The transfer gate electrode Tx3 is used to transfer the signal charge in the transfer gate electrode Tx2 to the diffusion node.

The CMOS image sensor of FIG. 3B is generally similar to that of FIG. 3A except for a physical distance between the transfer gate electrode Tx3 and a diffusion node, dopant concentration, and the structure of the diffusion node. During reset or transfer operations, after a turn-off voltage is applied to the transfer gate electrode Tx1, a turn-on voltage is applied to the transfer gate electrode Tx3 to move signal charge captured in the transfer gate electrode Tx2 to the diffusion node. Therefore, when photocharge is emitted from a photodiode to a channel of a transfer transistor, a region between the diffusion node and the channel is sent to a high-impedance state so that the emission of charge from the diffusion node to the channel does not occur. Also, when the signal charge is transferred from the channel to the diffusion node, a region between the photodiode and the channel is sent to a high-impedance state. Therefore, the structure of FIG. 3B can always have uniform reset and transfer characteristics.

Accordingly, the transfer gate electrode Tx3 and the diffusion node may form a typical structure in which a source and drain expansion region 304($a$) is disposed under a sidewall insulating layer. Also, FIG. 3A illustrates a structure in which the transfer gate electrode Tx3 is partially disposed on the diffusion node, which is embodied by reducing the total width of the transfer transistor or applying a turn-off voltage of the transfer gate electrode Tx3 to the diffusion node in order to prevent the emission of charge from the diffusion node. In this case, the structure of FIG. 3A can always have constant reset and transfer characteristics like the structure of FIG. 3B.

Therefore, the CMOS image sensor according to the current embodiment of the present invention can obtain expected effects irrespective of the change in a material or forming process of the sidewall insulating layer, the change in the dopant concentration or structure of the diffusion node, the use or disuse of an expansion region, a process of overlapping a gate electrode and a diffusion node, a process of overlapping gate electrodes, and other structural changes. However, when the transfer gate electrode Tx3 overlaps the diffusion node, a boundary region 320 between the diffusion node and a substrate 301 should be disposed in a region 321, which is a region where instantaneous emission of charge from the diffusion node to the substrate 301 disposed under a channel of the transfer gate electrode Tx3 does not occur due to an edge effect when a turn-off voltage is applied to the transfer gate electrode Tx3 and a turn-on voltage is applied to the transfer gate electrode Tx2.

Referring to FIG. 3C, at least one gate electrode (e.g., gate electrodes 307' and 308') of the transfer gate electrodes Tx1, Tx2, and Tx3 may partially overlap an adjacent gate electrode. It is illustrated in FIG. 3C that a diffusion node includes two $n^+$ regions 304($a$) and 304($b$) having a step difference like in FIG. 3B. However, even if one transfer gate electrode overlaps another transfer gate electrode like in FIG. 3C, the diffusion node may have another shape, for example, the shape shown in FIG. 3A.

Although not shown in the drawings, at least one additional gate electrode may be further disposed between the transfer gate electrodes Tx1 and Tx2 and/or between the transfer gate electrodes Tx2 and Tx3 and electrically insulated from other gate electrodes.

Figure 4:
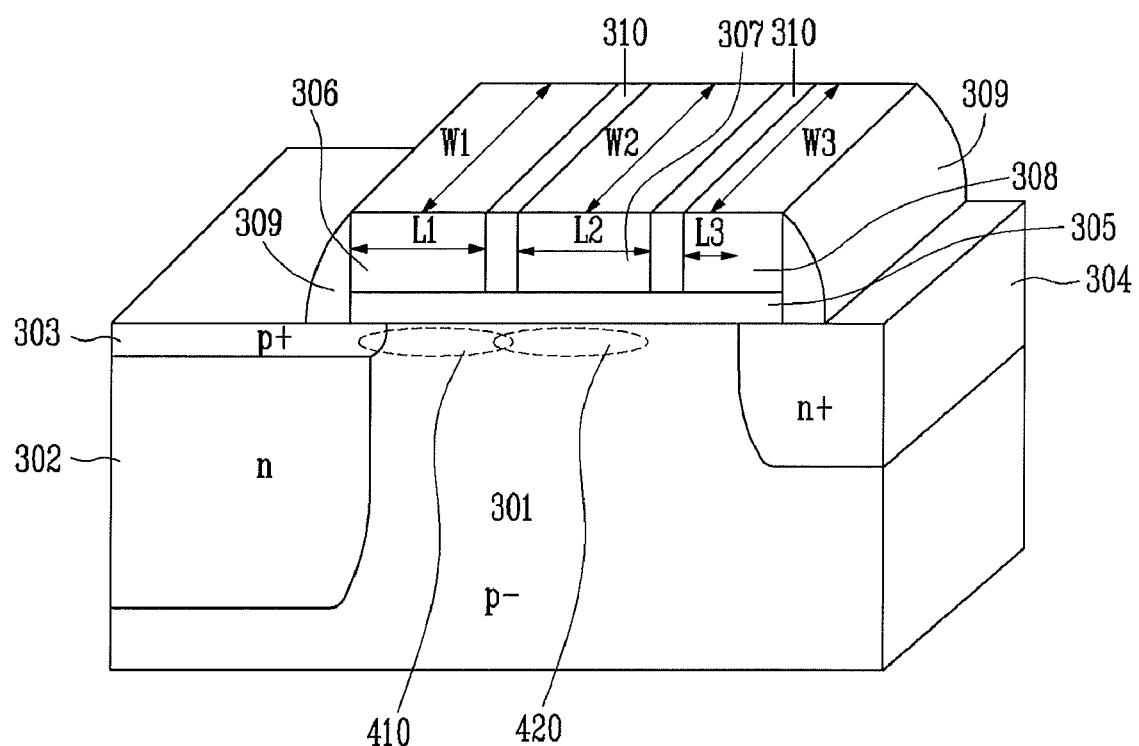
FIG. 4 is a perspective view of a photodiode and a transfer transistor of a CMOS image sensor according to an exemplary embodiment of the present invention.

Referring to FIG. 4, a turn-on voltage is applied to a gate electrode 306 disposed closest to a photodiode during reset or transfer operation of the photodiode, so that a potential barrier present between the photodiode and a channel of a transfer transistor can be effectively suppressed and accumulated photocharge can be moved to a diffusion node 304 using the remaining gate electrodes 307 and 308. In this case, a driving voltage should be applied to the transfer gate electrodes Tx1 and Tx2 to facilitate the motion of the photocharge and prevent the emission of charge from the diffusion node 304.

In order to employ a deep depletion effect without the influence of the diffusion node during the reset and transfer operations of the photodiode, when a specific turn-on voltage is applied to the transfer gate electrodes Tx1 and Tx2, each of an amount Q1 of charge of an equilibrium channel of the transfer gate electrode Tx1 and an amount Q2 of charge of an equilibrium channel of the transfer gate electrode Tx2 should be higher than the maximum amount Qwc of photocharge that can be accumulated in each photodiode, and a difference between each of the amounts Q1 and Q2 and the maximum amount Qwc may be as great as possible. In this case, the amount Q1 of the charge of the equilibrium channel of the transfer gate electrode Tx1 is determined by a length L1 and width W1 of the transfer gate electrode Tx1 and the material and thickness of a gate insulating layer of the transfer gate electrode Tx1, and the amount Q2 of the charge of the equilibrium channel of the transfer gate electrode Tx2 is determined by a length L2 and width W2 of the transfer gate electrode Tx2 and the material and thickness of a gate insulating layer of the transfer gate electrode Tx2.

In order to prevent the loss of signal charge, the amount Q2 of the charge of the equilibrium channel of the transfer gate electrode Tx2 should be higher than the maximum amount Qwc of photocharge that can be accumulated in the photodiode. Also, the width or area of the transfer gate electrode Tx3, which is closest to the diffusion node, may be smaller than the width or area of each of the transfer gate electrodes Tx2 and Tx1.

A portion of the transfer gate electrode Tx3 that does not overlap the diffusion node may have such a length L3, so as to prevent a turn-on voltage applied to the transfer gate electrode Tx2 from affecting the diffusion node through a gate insulating layer 305, a gate electrode material insulating layer 310, or substrate 301, i.e., such a length L3, so as not to change a voltage of the diffusion node even if the turn-on voltage is applied to the transfer gate electrode Tx2. For example, a driving voltage of the gate electrode 308 that is adjacent to the diffusion node may be slightly lower than driving voltages of other gate electrodes.

When satisfying the above-described conditions, channel forming regions 410 and 420 disposed under the transfer gate electrodes Tx1 and Tx2 adjacent to the photodiode are deeply depleted. Thus, when the photodiode is a complete-depletion type, the electric potentials of the channel forming regions 410 and 420 disposed under the transfer gate electrodes Tx1 and Tx2 can boost the pinning voltage of the photodiode and lessen the influence of process variables. Also, in an incomplete-depletion-type photodiode in which mobile charge remains after reset or transfer operation, when the reset and transfer operations are performed at the same voltage, the amount of mobile charge remaining in the photodiode is made to be smaller, an increase in dark current due to the incomplete depletion of the photodiode is suppressed, and a variation in the amount of charge remaining in the photodiode due to the changes of process variables, an operating voltage, and a method of applying the operating voltage is suppressed, so that the pinning voltage of the photodiode may not be dropped, optical characteristics can be maintained, and the occurrence of dark current, fixed pattern noise, and image lag can be inhibited at a low operating voltage. The above-described operation of the gate electrode using deep depletion is caused by gate coupling and facilitated when the amount of electrons to be collected in the gate electrode is more than the amount of electrons collected in a channel of the gate electrode.

Figure 5A:
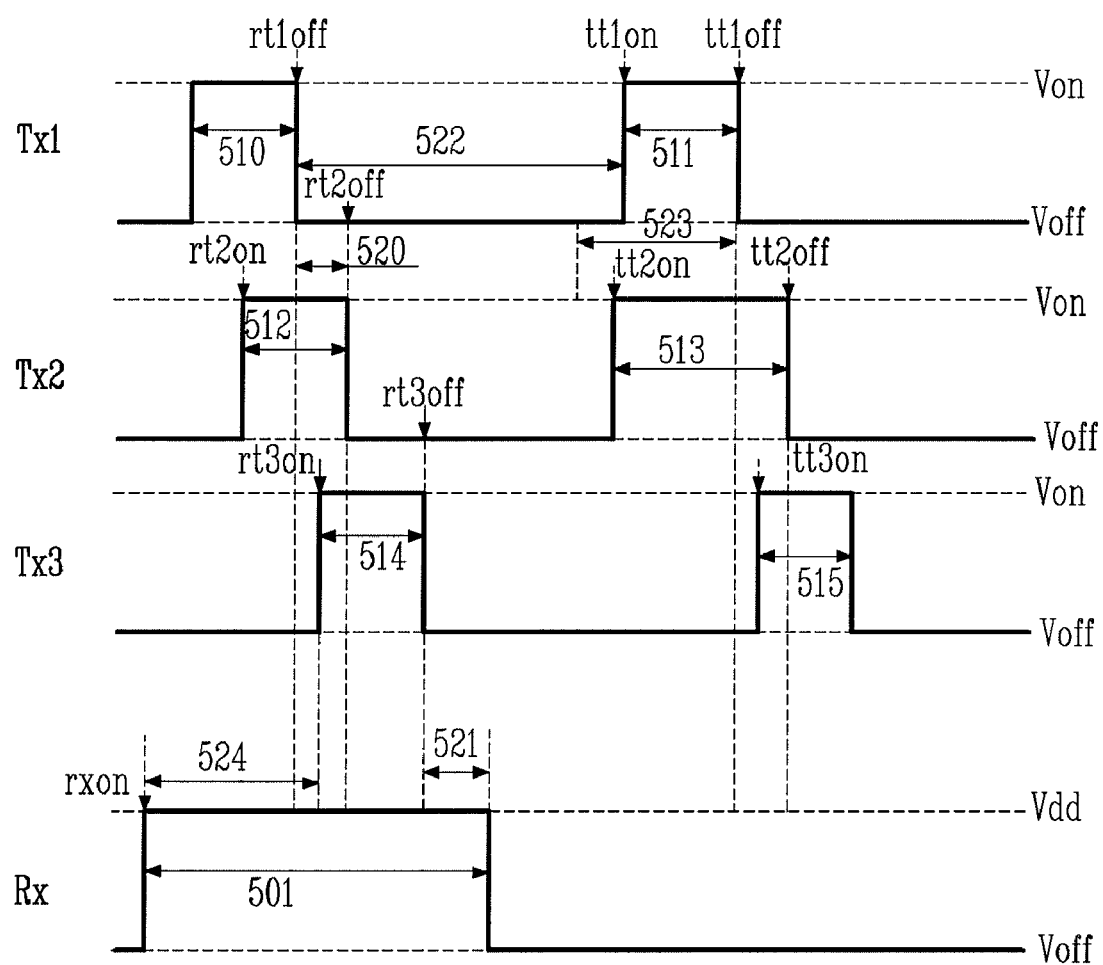
FIGS. 5A through 5C are signal waveform diagrams illustrating methods of driving a transfer transistor according to exemplary embodiments of the present invention.

FIG. 5A is a signal waveform diagram illustrating a method of driving a transfer transistor including the transfer gate electrodes Tx1, Tx2, and Tx3 and a reset transistor Rx during reset and transfer operations of a photodiode in the transfer transistor including three transfer gate electrodes shown in FIGS. 3A, 3B, 3C, and 4.

As described above, the transfer gate electrode Tx1 denotes a gate electrode that is closest to a photodiode, the transfer gate electrode Tx3 denotes a gate electrode that is closest to a diffusion node, and the transfer gate electrode Tx2 is a gate electrode interposed the transfer gate electrodes Tx1 and Tx3.

Referring to FIG. 5A, a photodiode reset period 510, reset end periods 512 and 514, a diffusion node reset period 521, a charge accumulation period (i.e., an integration time) 522, and transfer periods 511, 513, and 515 are illustrated. In the reset end periods 512 and 514, charge emitted from the photodiode is removed from a photosensitive pixel. In the integration time 522, charge is accumulated due to photons. In the transfer periods 511, 513, and 515, photocharge accumulated in the photodiode is transferred to the diffusion node. After each of the diffusion node reset period 521 and the transfer periods 511, 513, and 515, a read period may be added to perform correlated double sampling (CDS). The read period in which several pixels are read in sequence is shorter than the integration time 522.

A method of driving the transfer transistor of the CMOS image sensor according to the current embodiment of the present invention will now be described with reference to FIG. 5A. In this method, the respective transfer gate electrodes Tx1, Tx2, and Tx3 are controlled during the reset or transfer operation of the photodiode. Also, a turn-on voltage is applied to the transfer gate electrode Tx2 (refer to rt2on and tt2on) before a turn-off voltage is applied to the transfer gate electrode Tx1 (refer to rt1off and tt1off), and a turn-on voltage is applied to the transfer gate electrode Tx3 (refer to rt3on and tt3on) after the turn-off voltage is applied to the transfer gate electrode (refer to rt1off and tt1off) and before a turn-off voltage is applied to the transfer gate electrode Tx2 (refer to rt2off and tt2off), i.e., during a period 520. In order to shorten the total reset time and transfer time, the turn-on voltage is applied to the transfer gate electrode Tx2 (refer to rt2on and tt2on) before or while applying a turn-on voltage to the transfer gate electrode Tx1, as in a period 523. However, the turn-on voltage should be applied to the transfer gate electrode Tx2 before points in time rt1off and tt1off at which the turn-off voltage is applied to the transfer gate electrode Tx1. Most preferably, the turn-on voltages are simultaneously applied to the transfer gate electrodes Tx1 and Tx2.

Also, since a point in time rxon at which a turn-on voltage is applied to the reset transistor should precede a point in time rt3on at which the turn-on voltage is applied to the transfer gate electrode Tx3, the turn-on voltage is applied to the reset transistor during a period 524.

Figure 5B:
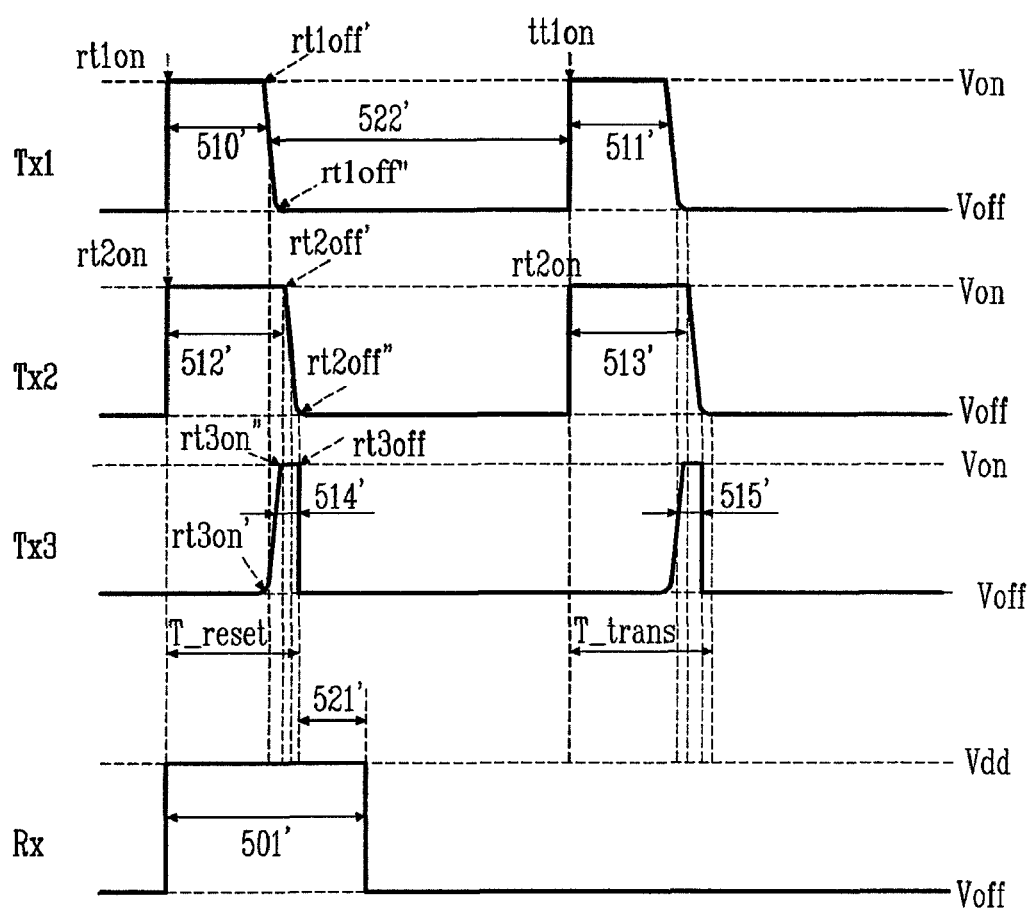

In the method of driving the transfer transistor according to the present invention, it is most important that the respective gate electrodes should be controlled to send a region between the photodiode and the diffusion node to a high impedance state when charge is transferred from the photodiode to the channel region of the transfer transistor. Therefore, when the charge is emitted from the photodiode, the influence of the diffusion node is excluded so that dark current, fixed pattern noise, and the deterioration of the image sensor due to process deviations can be reduced. Also, since a power supply voltage, which is the highest available voltage, can be used as a turn-on voltage, well capacity and a dynamic range can increase. FIG. 5B is a signal waveform diagram illustrating a method of driving a transfer transistor including the transfer gate electrodes Tx1, Tx2, and Tx3 and a reset transistor Rx according to a variation of the current embodiment of the present invention, which can shorten times taken to reset and transfer a photodiode and increase the efficiency of the reset and transfer operations.

In order to shorten the times T_reset and T_trans taken to reset and transfer the photodiode and increase the efficiency of the reset and transfer operations, turn-on voltages are applied to transfer gate electrodes Tx1 and Tx2 at the same point in time (rt1on and rt2on, tt1on and tt2on). Also, a turn-on voltage may be applied to the reset transistor Rx (refer to rxon) at the same time as when the turn-on voltages are applied to the transfer gate electrodes Tx1 and Tx2 (refer to rt1on and rt2on), in order to lessen a time 501' taken to reset the entire image sensor. Furthermore, a time 521' taken to reset the diffusion node of the time 501' may be as short as possible. The time 521' may correspond to a time taken to reset a diffusion node of a conventional 4-transistor image sensor.

During the times T_reset and T_trans taken to reset and transfer the photodiode, a substantial time taken to emit charge from the photodiode to the channel region of the transfer transistor may correspond to periods 510' and 511'. Thus, the times 510' and 511' taken to apply the turn-on voltage to the transfer gate electrode Tx1 and maintain the turn-on voltage during the times T_reset and T_trans may be sufficiently long so as to transfer all charge accumulated in the photodiode toward the diffusion node.

In order to obtain the signal waveform diagram of FIG. 5B, after the transfer gate electrode Tx1, which is disposed closest to the light receiving device, is completely turned off or fails, the transfer gate electrode Tx3 should be turned off at a minimum. Also, a time taken to turn on the transfer gate electrode Tx1 should be far longer than a time taken to turn on the transfer gate electrode Tx3. For example, the time taken to turn on the transfer gate electrode Tx1 disposed closest to the photodiode may account for at least a half the total driving time T_reset and T_trans of the transfer transistor.

To satisfy the above requirements, as long as the loss of charge emitted from the photodiode to the channel region of the transfer transistor does not occur during the reset or transfer operation of the transfer transistor, a turn-on voltage may be applied to the transfer gate electrode Tx3 (refer to rt3on') directly after a turn-off voltage is completely applied to the transfer gate electrode Tx1 (refer to rt1off"), a turn-off voltage may be applied to the transfer gate electrode Tx2 (refer to rt2off) directly after the turn-on voltage is completely applied to the transfer gate electrode Tx3 (refer to rt3on"), and a turn-off voltage may be applied to the transfer gate electrode Tx3 directly after the turn-off voltage is applied to the transfer gate electrode Tx2 (refer to rt2off").

Figure 5C:
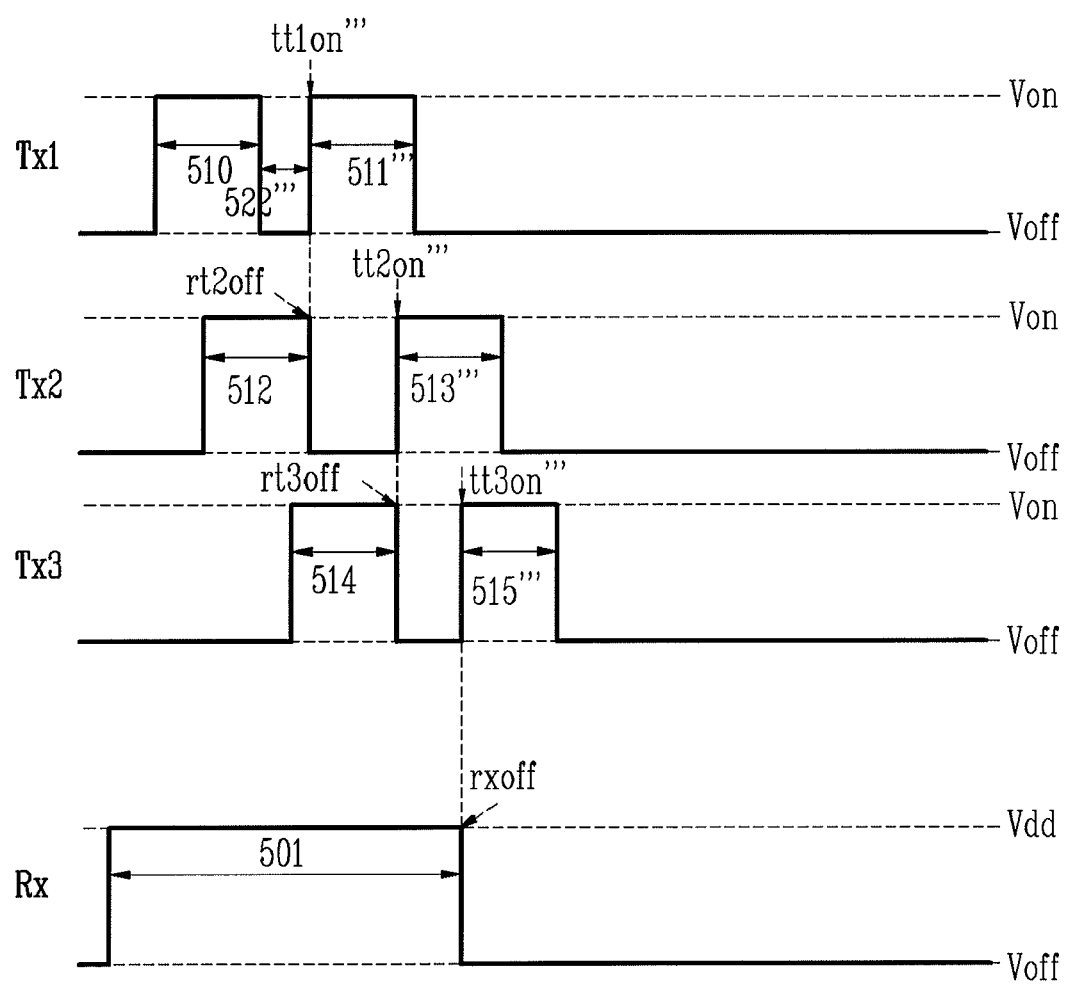

In a bright place where luminous intensity is high, the condition of a short integration time is required. FIG. 5C is a signal waveform diagram illustrating a method of driving a transfer transistor including the transfer gate electrodes Tx1, Tx2, and Tx3 and a reset transistor Rx, which includes the shortest integration time.

When a period in which a turn-on voltage is applied to at least one of three transfer gate electrodes to reset a light receiving device is referred to as a reset period, and a period in which a turn-on voltage is applied to at least one of the three transfer gate electrodes to transfer charge generated by the light receiving device is referred to as a transfer period, FIG. 5C illustrates a case where the reset period overlaps with the transfer period to effectively shorten the integration time.

In this case, in the transfer transistor, the transfer gate electrodes Tx1 and Tx2 are turned on before the reset transistor Rx is turned off during the transfer operation. However, the transfer gate electrode Tx3, which is disposed closest to the diffusion node, is turned on after the reset transistor Rx is turned off.

As described above, driving methods or signal waveforms of a transfer transistor having multiple gate electrodes may depend on whether the photodiode performs reset or transfer operation. In FIG. 5C, the transfer transistor may have the same driving method and signal waveforms as described with reference to FIGS. 5A and 5B during the reset operation of the photodiode. In comparison, during the transfer operation of the photodiode, in order to satisfy the condition of the short integration time, after a turn-on voltage for the reset operation is applied to the transfer gate electrode Tx2 and a turn-off voltage is completely applied (refer to rt2off), a turn-on voltage for the transfer operation may be applied to the transfer gate electrode Tx1 (refer to tt1on''').

Figure 2A:
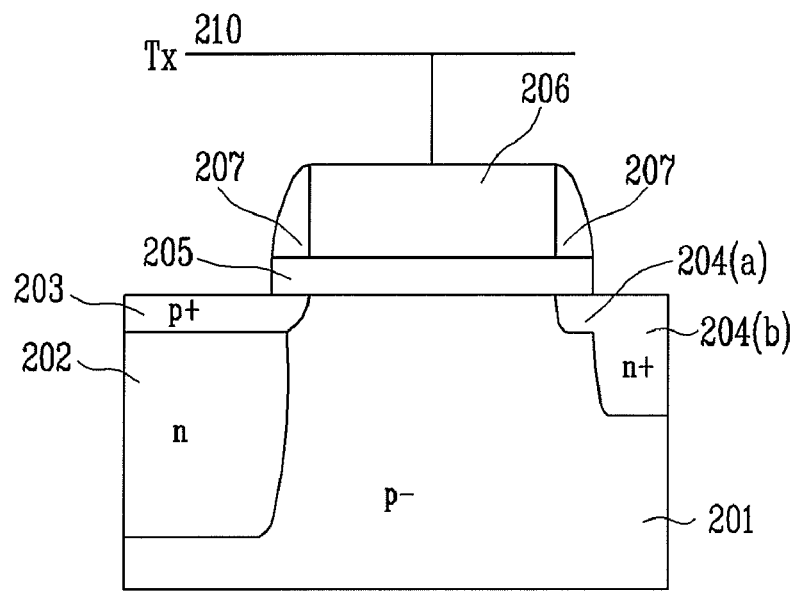
FIG. 2A is a cross-sectional view of a photodiode and a transfer transistor region of a conventional 4-transistor CMOS image sensor.
Figure 2B:
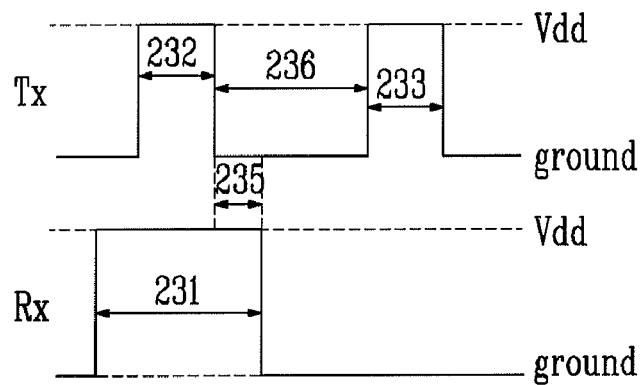
FIG. 2B is a signal waveform diagram illustrating methods of driving a transfer transistor and a reset transistor to transfer and reset a photodiode in a conventional 4-transistor CMOS image sensor.

The application rt3off of the turn-off voltage to the transfer gate electrode Tx3 should be followed by the application tt2on''' of the turn-on voltage to the transfer gate electrode Tx2 to perform the transfer operation. And, the application rxoff of the turn-off voltage to the reset transistor Rx should be followed by the application tt3on''' of the turn-on voltage to the transfer gate electrode Tx3. In FIG. 5C, the integration time taken for the photodiode to detect light and generate photocharge corresponds to a period 522'''. Thus, the transfer transistor having the three transfer gate electrodes Tx1, Tx2, and Tx3 can reduce the integration time to be shorter than the integration time of the transfer transistor including one transfer gate electrode as illustrated in FIG. 2A.

Although FIGS. 5A through 5C illustrate a case where turn-on voltages are sequentially applied to the transfer gate electrodes Tx1, Tx2, and Tx3 to sequentially enter the reset periods 510, 512, and 514 for resetting the photodiode, the present invention is not limited thereto. In other words, turn-on voltages may be simultaneously applied to some or all of the transfer gate electrodes Tx1, Tx2, and Tx3 to simultaneously enter some or all of the reset periods 510, 512, and 514.

Alternatively, turn-on voltages may be sequentially applied to the transfer gate electrodes Tx3, Tx2, and Tx1 in reverse order to sequentially enter the reset periods 514, 512, and 510. In this case, only characteristics are changed but reset operation can be performed in substantially the same manner. In conclusion, the transfer operation should be performed using the above-described method according to the present invention, while the reset operation may be variously performed.

Figure 6A:
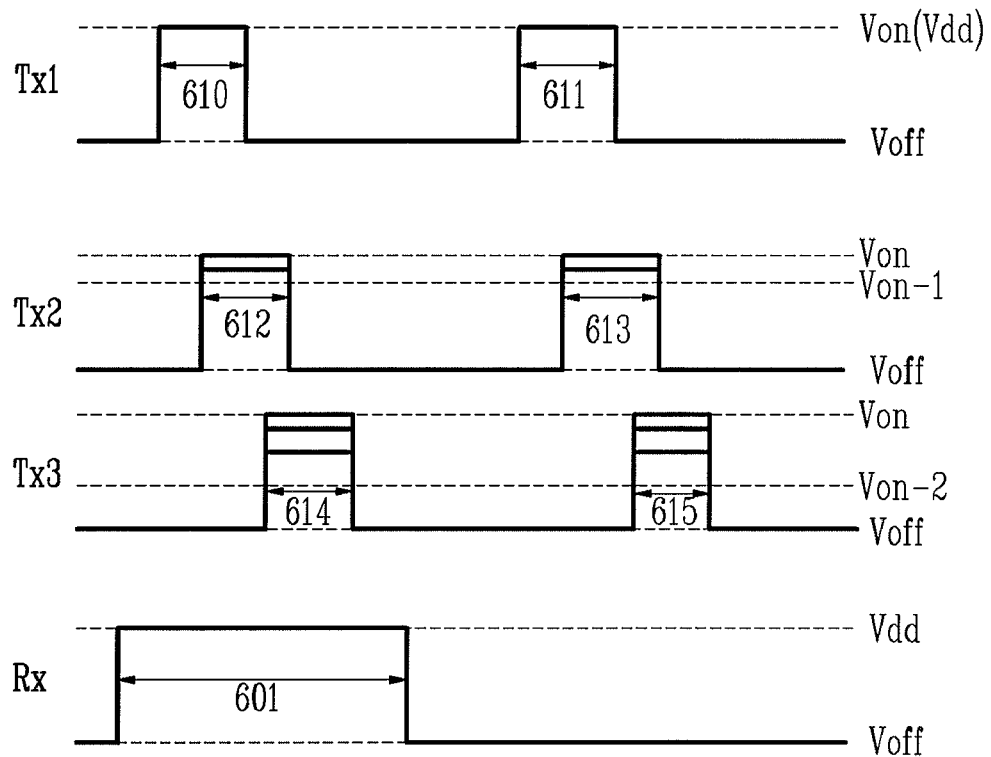
FIGS. 6A and 6B are signal waveform diagrams illustrating methods of driving a transfer transistor according to exemplary embodiments of the present invention.

FIG. 6A is a signal waveform diagram of turn-on voltages applied to the transfer transistor including the three transfer gate electrodes shown in FIGS. 3A, 3B, and 4 according to another variation of the current embodiment of the present invention. The time diagram of FIG. 6A is almost the same as that of FIG. 5A in terms of respective time periods, but it is different from the time diagram of FIG. 5A in that there are several voltage levels. Reference character Von refers to a turn-on voltage applied to a gate electrode, and Voff refers to a turn-off voltage applied to the gate electrode.

When photocharge is emitted from the photodiode, since the influence of the diffusion node can be eliminated due to the transfer gate electrode Tx3 disposed closest to the diffusion node, a voltage applied to the transfer gate electrode Tx1 disposed closest to the photodiode may be the highest available voltage. For example, a voltage higher than a power supply voltage Vdd may be applied using a voltage boosting circuit to the transfer gate electrode Tx1 disposed closest to the photodiode.

Each of turn-on voltages applied to the transfer gate electrodes Tx2 and Tx3 disposed closest to the diffusion node may have a predetermined range, and optimum turn-on voltages may be selected and applied to the transfer gate electrodes Tx2 and Tx3.

The lowest applicable turn-on voltage Von-1, which is applied to the transfer gate electrode Tx2, satisfies a condition where the amount Q2 of charge of an equilibrium determined by the turn-on voltage applied to the transfer gate electrode Tx2 is higher than the maximum amount Qwc of charge that can be accumulated in the photodiode. When a voltage higher than the lowest applicable turn-on voltage Von-1 is applied to the transfer gate electrode Tx2, the loss of photocharge does not occur, but a deep depletion effect caused by the transfer gate electrode Tx2 deteriorates. Therefore, as long as there is neither the influence of hot carriers nor the degradation of a gate insulating layer, the same voltage as the power supply voltage Vdd applied to the transfer gate electrode Tx1 can be applied to the transfer gate electrode Tx2. However, even if a voltage lower than the voltage applied to the transfer gate electrode Tx1 is applied to the transfer gate electrode Tx2, as long as a condition where the loss of charge does not occur is satisfied, the motion of charge is enabled.

The lowest turn-on voltage Von-2 applicable to the transfer gate electrode Tx3 disposed closest to the diffusion node is a voltage that satisfies a condition where a low impedance is maintained between a channel region disposed under the transfer gate electrode Tx2 and the diffusion node. In this case, the transfer transistor may operate under a condition where electrons are emitted from the diffusion node or under a condition where electrons are not emitted from the diffusion node. In the latter case, the transfer transistor operates in the same manner as the previous transfer transistor. In the former case, since signal charge read from the photodiode by the previous transfer transistor is determined in the channel in advance, the transfer transistor is not affected. Thus, the lowest voltage applicable to the transfer gate electrode Tx3 is a voltage higher than a threshold voltage, which is dependent on the thickness and material of a gate insulating layer of the transfer gate electrode Tx3 and the dopant concentration of a silicon bulk disposed under the gate insulating layer, and the highest applicable voltage is a power supply voltage Vdd, which is the highest possible operating voltage. Meanwhile, in another embodiment, turn-on voltages having at least two different levels may be sequentially applied to the transfer gate electrodes Tx2 and Tx3 excepting the transfer gate electrode Tx1 disposed closest to the photodiode. For example, the application of a turn-on voltage having a lower level may be followed by the application of a turn-on voltage having a higher level to result in a staircase waveform.

In this case, the turn-on voltage having the lowest level, which is applied to the transfer gate electrodes Tx2 and Tx3, may be simultaneously applied to the transfer gate electrodes Tx2 and Tx3. Assuming that the transfer transistor includes at least four gate electrodes, the turn-on voltage having the lowest level may be simultaneously applied to some or all of the gate electrodes excepting the transfer gate electrode Tx1.

Also, when a voltage applied to the transfer gate electrode Tx1 disposed closest to the photodiode is switched from a turn-on voltage to a turn-off voltage, voltages applied to some or all of the gate electrodes excepting the transfer gate electrode Tx1 may simultaneously make the transition from a first level to a second level.

Figure 6B:
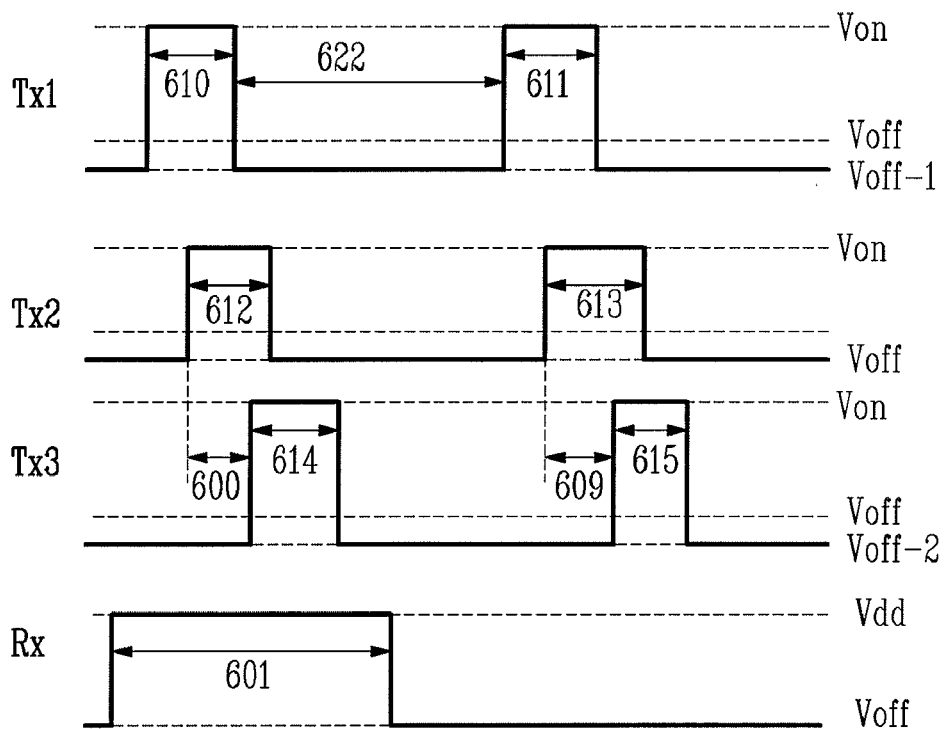

FIG. 6B is a signal waveform diagram of turn-off voltages applied to the transfer transistor including the three transfer gate electrodes shown in FIGS. 3A, 3B, and 4 according to another variation of the current embodiment of the present invention. Reference character Von refers to a turn-on voltage applied to a gate electrode, and Voff refers to a turn-off voltage applied to the gate electrode.

A turn-off voltage Voff-1 applied to the transfer gate electrode Tx1 disposed closest to the photodiode may be a ground voltage or lower.

Also, a turn-off voltage applied to the transfer gate electrode Tx1 disposed closest to the photodiode may be at a lower level than a turn-off voltage applied to the other gate electrodes.

The turn-off voltage Voff-1, which is a negative voltage, may depend on the material of the gate electrode, the kind and thickness of a gate insulating layer, the doping extent of a channel, and the dopant concentration of a silicon bulk. In a region (refer to 302 of FIG. 4) where a potential well is formed to accumulate photocharge in the photodiode, when a potential barrier is lowest in a channel forming region of a substrate 301 adjacent to the photodiode due to a difference in work function between a gate electrode material and the channel forming region of the substrate 301, a negative voltage is applied as a turn-off voltage Voff-1 to the transfer gate electrode Tx1 so that the well capacity of the photodiode can be increased.

In this case, the turn-off voltage Voff-1 may be higher than a voltage at which the accumulation of holes starts in the channel forming region and lower than a voltage that leads to formation of a potential barrier equal to or higher than a potential barrier formed between the substrate 301 and the region 302 where the photocharge is accumulated.

When the potential barrier of the channel forming region of the substrate 301 adjacent to the photodiode is higher than the potential barrier between the substrate 301 and the photodiode, the turn-off voltage Voff-1 applied to the transfer gate electrode Tx1 may be a ground voltage.

Also, a period for applying the specific turn-off voltage to the transfer gate electrode Tx1 may correspond to the entire period for applying a turn-off voltage Voff-1 to the transfer gate electrode Tx1. In order to increase the well capacity of the photodiode, the specific turn-off voltage should be applied to the transfer gate electrode Tx1 during a period 622 in which photocharge is accumulated in the photodiode.

Also, a turn-off voltage Voff-2 applied to the transfer gate electrode Tx2 disposed adjacent to the diffusion node may be a ground voltage, or, more preferably, a negative voltage. During periods 610 and 611 in which charge is transferred from the photodiode to a channel disposed under a gate oxide layer of the transfer gate electrode Tx1 or Tx2, the photodiode and the transfer gate electrode Tx1 or Tx2 should be in a low impedance state, while the diffusion node (refer to 304 of FIG. 4), the charge accumulation region 302 of the photodiode, and the channel forming regions (refer to 410 and 420 of FIG. 4) of the gate electrodes Tx1 and Tx2 to which the turn-on voltages are applied should be maintained in a high impedance state, i.e., a turn-off state.

For this, a negative voltage is applied as a turn-off voltage to the transfer gate electrode Tx3 so that the diffusion node and the regions 302, 410, and 420 may have higher impedances during the emission of photocharge from the photodiode. Also, by applying the negative voltage as the turn-off voltage to the transfer gate electrode, the diffusion node may not be affected by process variables, such as the length L3 and the width W3 of FIG. 4, the dopant concentration or structure of the diffusion node, the use or disuse of an expansion region, the extent of overlap between a gate electrode and the diffusion node. And, deep depletion operations of the gate electrodes Tx1 and Tx2 and the emission of charge from the diffusion node to the channel region of the transfer transistor can be prevented. A period for applying the specific turn-off voltage to the transfer gate electrode Tx3 may be the entire period for applying a turn-off voltage to the transfer gate electrode Tx3. The turn-off voltage may be applied to the transfer gate electrode Tx3 at least during periods 600 and 609, which are continued directly after the turn-on voltage is applied to the transfer gate electrode Tx2 before the turn-on voltage is applied to the transfer gate electrode Tx3, and some periods to attain expected effects.

Meanwhile, a turn-off voltage applied to the gate electrodes (i.e., the transfer gate electrode Tx2), excepting the transfer gate electrode Tx1 disposed closest to the photodiode and the transfer gate electrode Tx3 disposed closest to the diffusion node, may be between the ground voltage and the threshold voltage of the transfer transistor.

Rising and falling times of signals applied to the transfer transistor including the three transfer gate electrodes as shown in FIGS. 3A, 3B, and 4 will now be described with reference to FIG. 5B. It is obvious that the following description may be applied to FIGS. 6A and 6B to obtain signal waveforms having clear rising and falling times.

A rising time refers to a time continued between a point in time (e.g., rt3on') at which the application of a fixed turn-on voltage starts and a point in time (e.g.,rt3on") at which the application of the turn-on voltage is completed. A falling time refers to a time continued between a point in time (e.g., rt2off') at which the application of a fixed turn-off voltage starts, and a point in time (e.g., rt2off") at which the application of the turn-off voltage is completed.

The suppression of a potential barrier present between the photodiode and the channel region of the transfer transistor is greatly affected by not only a turn-on voltage applied to the transfer gate electrode Tx1 adjacent to the photodiode and a channel state, but also by a voltage application method. In order to effectively suppress the potential barrier present between the photodiode and the channel region of the transfer transistor during the emission of photocharge accumulated in the photodiode, time taken to apply a specific turn-on voltage to the transfer gate electrode Tx1 disposed adjacent to the photodiode after the turn-off voltage is applied may include the shortest possible rising time that can be allowed by a voltage application circuit.

Thus, each of the transfer gate electrodes Tx1 and Tx2 may have the shortest possible rising time, and the transfer gate electrode Tx3 may have the shortest possible turn-on time, which is shorter than the rising time of the transfer gate electrode Tx3, in order to shorten a time taken to perform the entire reset and transfer operations.

Specifically, a rising time of the turn-on voltage applied to the transfer gate electrode Tx3 disposed closest to the diffusion node is at least twice the rising time of the turn-on voltage applied to the transfer gate electrode Tx1 disposed closest to the photodiode.

The emission of photocharge from the photodiode through a channel region of an adjacent gate electrode to the diffusion node is greatly affected by a method of applying turn-off voltages to multiple gate electrodes of the transfer transistor. Although only operation of resetting the photodiode will now be described, it is clear that transfer operation is similar to the reset operation. Directly after a turn-off voltage is applied to the transfer gate electrode Tx1 at a point in time rt1off", signal charge captured in the channel region disposed under the transfer gate electrode Tx1 is transferred to the channel region disposed under the transfer gate electrode Tx2.

Thereafter, when a turn-on voltage is applied to the transfer gate electrode Tx3 at a point in time rt3on", the signal charge is rearranged and transferred to the diffusion node. Finally, when a turn-off voltage is applied to the transfer gate electrode Tx2 at a point in time rt2off", signal charge captured under the turned-off transfer gate electrode Tx2 is transferred to the channel region disposed under the transfer gate electrode Tx3 and the diffusion node.

When the transfer gate electrode is turned off, the signal charge is transferred as described above due to a lateral electric field parallel to the surface of the channel region. In this case, the signal charge captured due to a gate voltage may be transferred to a portion deviating from a signal charge transmission path, for example, a substrate, to induce the loss of signal charge or may return to the photodiode to cause dark current components or degradation, such as image lag.

In order to prevent the foregoing problems, when a turn-off voltage is applied to the transfer gate electrode Tx1 or Tx2 at a point in time rt1off" or rt2off", turn-on voltages should be applied to the gate electrode to the turn-off voltage is applied and its adjacent transfer gate electrode Tx2 or Tx3 and a falling time, which is taken to apply a turn-off voltage after a turn-on voltage is applied, should be as long as possible as long as the operating speed of the image sensor is not seriously degraded, so that the highest lateral electric field parallel to the channel surface can be provided toward the diffusion node during the transfer of the signal charge.

For example, when a rising time of a turn-on voltage applied to the transfer gate electrode Tx1 disposed closest to the photodiode is shortened, a falling time of a turn-on voltage applied to each of the gate electrodes may be at least twice that of the shortened rising time.

Embodiment 2

An image sensor according to the current embodiment of the present invention includes a photodiode, a photosensitive pixel including a transfer transistor for transferring photocharge generated by the photodiode to a diffusion node, and a control unit for controlling the voltage application times, voltage elimination times, voltage maintaining times, and applied voltages of multiple gate electrodes of the transfer transistor.

In the CMOS image sensor according to the present embodiment, the transfer transistor includes two transfer gate electrodes in order to eliminate the influence of the diffusion node on the electric potential of the photodiode during reset and transfer operations of the photodiode.

FIGS. 7A through 7E are cross-sectional views of photodiodes and transfer transistors of CMOS image sensors according to the current embodiment of the present invention.

Since components shown in FIGS. 7A through 7E are almost the same as those of FIG. 4, a detailed description thereof will be omitted and only the transfer transistor will be mainly described.

In FIGS. 7A through 7E, the transfer transistor includes two gate electrodes 706 and 708, which are electrically isolated from each other, a gate insulating layer 705, a sidewall insulating layer 710, and a substrate 301. Two transfer gate electrodes of the transfer transistor include the two gate electrodes 706 and 708, an insulating material 709 for electrically isolating the gate electrodes 706 and 708 from each other, the gate insulating layer 705, and control lines 730 and 731 for applying voltages to the gate electrodes 706 and 708 and controlling the same. Hereinafter, the two transfer gate electrodes having the foregoing structures will be referred to as Txa and Txb.

In the image sensor according to the present embodiment, each of the control lines 730 and 731 may further include a circuit for controlling a time taken to apply a turn-on voltage or turn-off voltage and a time to maintain the application of the turn-on voltage or turn-off voltage, a switching device for allowing or cutting off the application of a voltage, and/or a control unit for controlling the turn-on voltage or turn-off voltage.

When a specific turn-on voltage is applied to a transfer gate electrode Txa disposed adjacent to a photodiode, the amount of charge of an equilibrium channel of the transfer gate electrode Txa should be higher than the maximum amount of photocharge that can be accumulated in the photodiode, and a difference therebetween may be as great as possible. In this case, the amount of the charge of the equilibrium channel of the transfer gate electrode Txa is determined by the length and width of the transfer gate electrode Txa and the material and thickness of the gate insulating layer 705. The gate electrode Txb 708 has such an appropriate length Lb, Lb', or Lb", so as to prevent a turn-on voltage applied to the transfer gate electrode Txa from affecting the diffusion node through the gate insulating layer 705, the insulating material 709, and the substrate 301, or prevent the turn-on voltage applied to the transfer gate electrode Txa from affecting the voltage of the diffusion node.

Figure 7A:
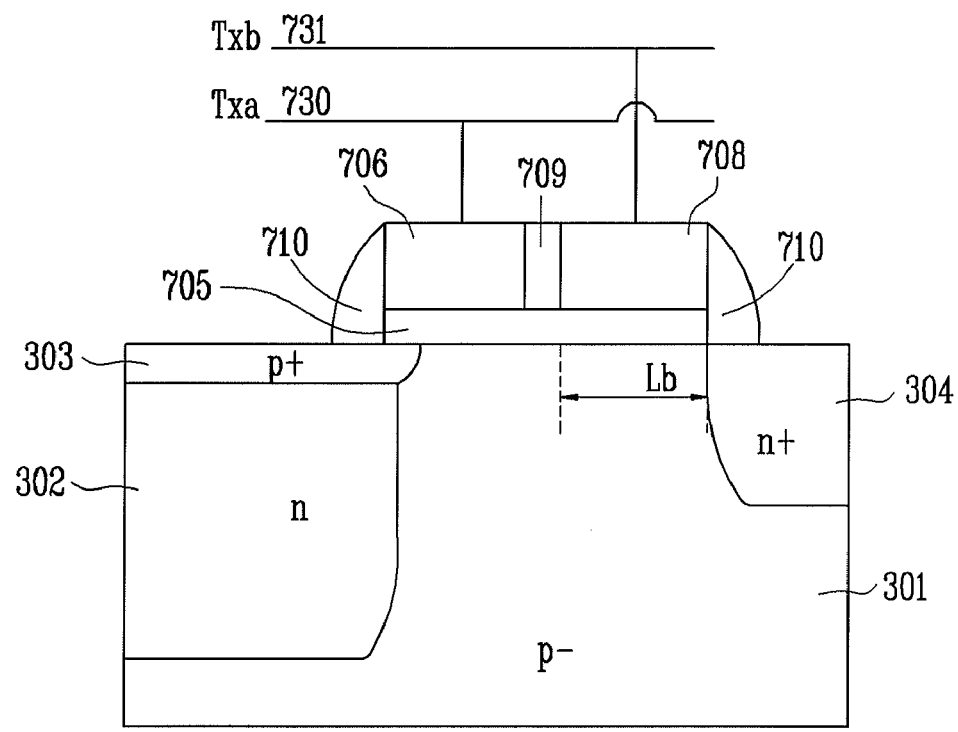
FIGS. 7A through 7E are cross-sectional views of photodiodes and transfer transistors of CMOS image sensors according to other exemplary embodiments of the present invention.

Each of the structures shown in FIGS. 7B through 7E is generally similar to that of FIG. 7A except for physical and electrical changes of a diffusion node, such as a physical distance between the transfer gate electrode Txb and the diffusion node, dopant concentration, and a change in the structure of the diffusion node (e.g., source and drain expansion regions) or the extent of overlap between electrode materials of the transfer gate electrode Txa and Txb.

Figure 7B:
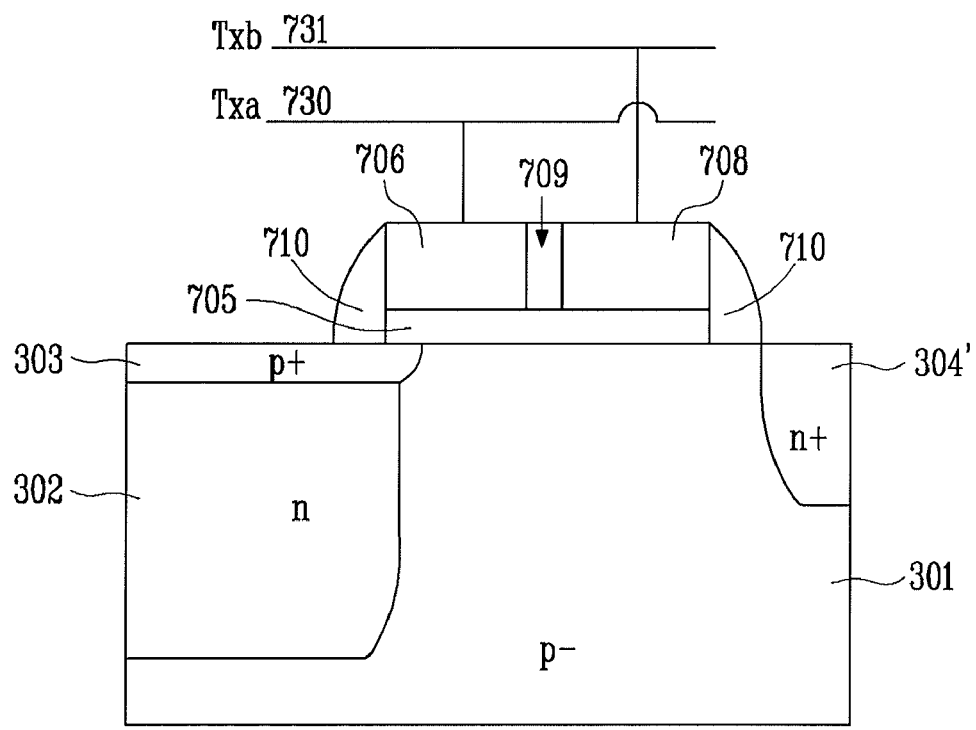
Figure 7C:
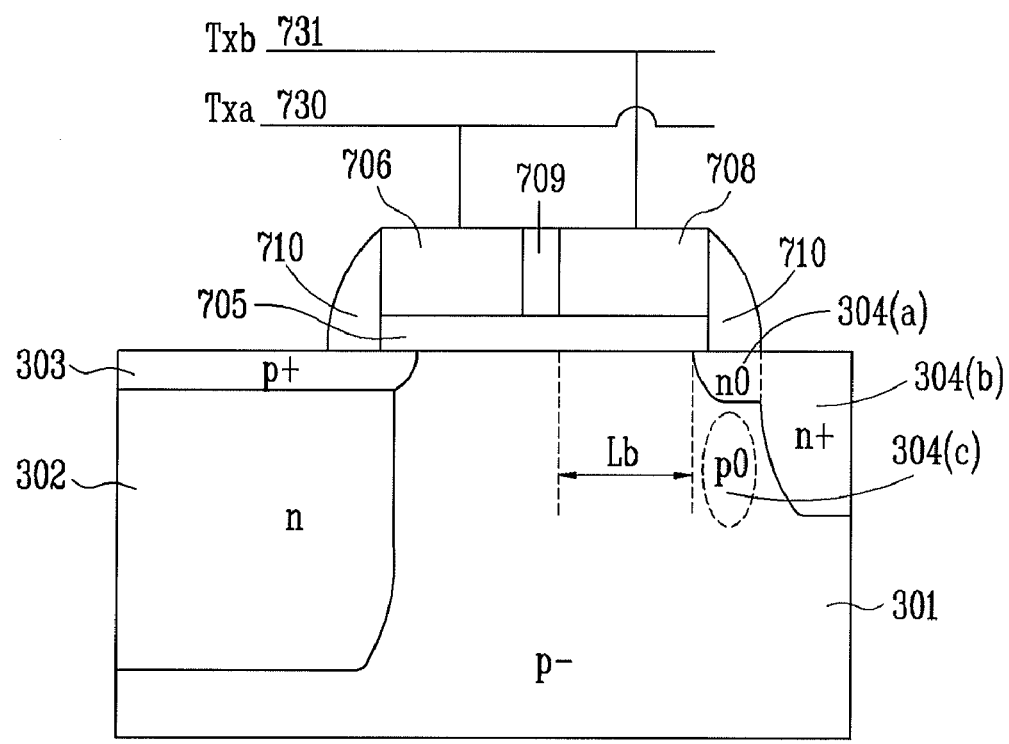
Figure 7D:
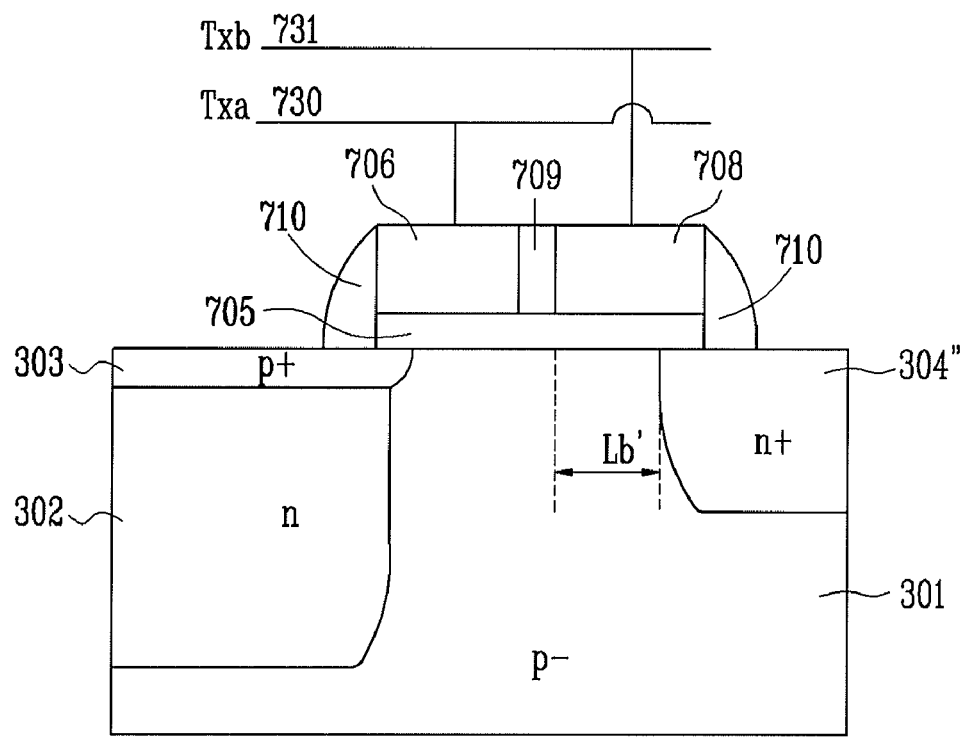
Figure 7E:
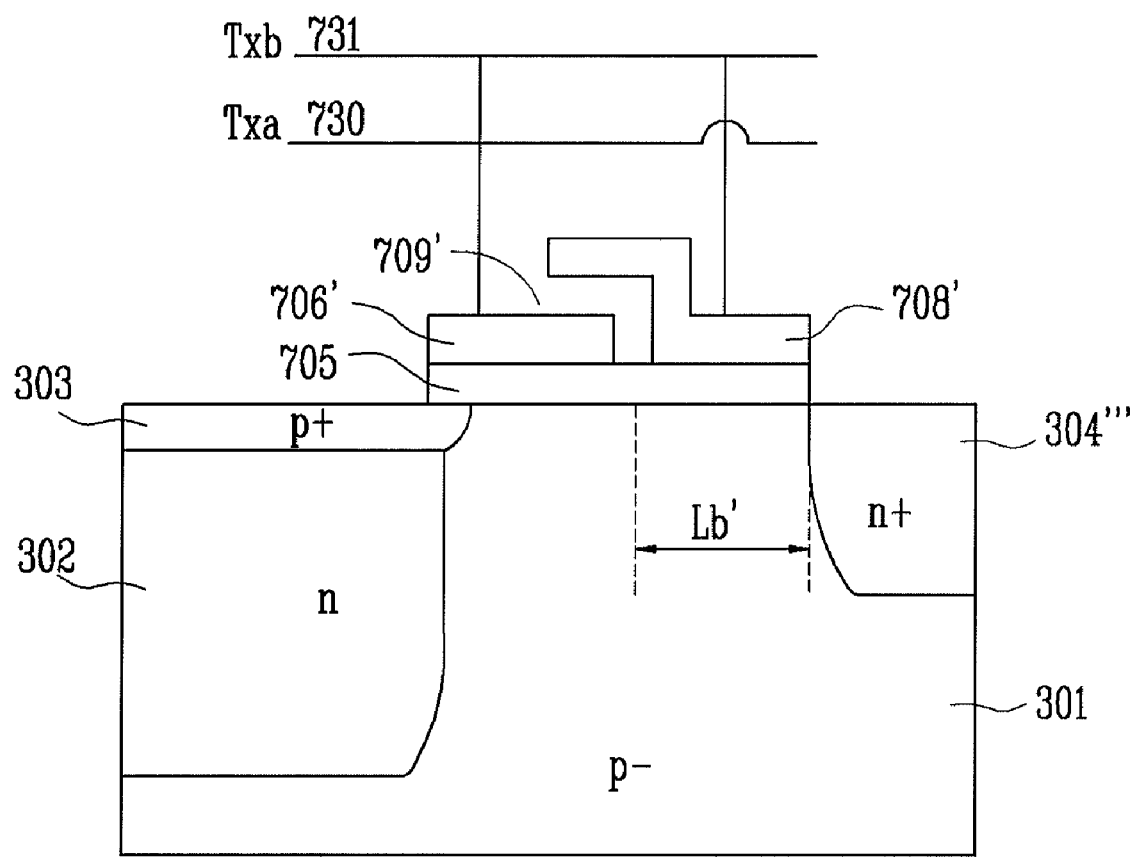

In order to suppress the emission of electrons from the diffusion node to a channel, it is more effective to use one of the structures shown in FIGS. 7A, 7B, 7C, and 7E, in which the gate electrode 708 of the transfer gate electrode Txb does not overlap a drain doping region 304, 304(a), 304(b), 304(c), 304', or 304''' of the transfer transistor, than the structure shown in FIG. 7D in which the gate electrode 708 of the transfer gate electrode Txb overlaps a drain doping region 304'' of the transfer transistor.

The exemplary embodiments shown in FIGS. 7A through 7E are almost the same in that the influence of the diffusion node is eliminated using two transfer gate electrodes and a potential barrier is effectively suppressed using a deep depletion state, but they are different in terms of process variables or design specifications. Also, in FIGS. 7A through 7E, the transfer gate electrodes Txa and Txb correspond to the transfer gate electrodes Tx1 and Tx3, respectively, of FIG. 3 so that the transfer gate electrodes Txa and Txb have similar structural characteristics to the transfer gate electrodes Tx1 and Tx3 as described with reference to FIG. 3.

In Embodiment 1, the transfer gate electrode Tx2 functions to transfer photocharge or electrons required for reset operation from the transfer gate electrode Tx1 to the transfer gate electrode Tx3 and finally transfer the photocharge or electrons to the diffusion node. The transfer gate electrode Tx1 functions to receive electrons from the photodiode by entering a deep depletion mode or reducing a barrier. The transfer gate electrode Tx3 functions to transfer electrons to the diffusion node in a non-deep-depletion state or under a condition where no electrons are emitted from the diffusion node. In comparison, the transfer gate electrode Tx2 only connects the transfer gate electrodes Tx1 and Tx3. Thus, even if the transfer gate electrode Tx2 is omitted, only the transfer gate electrodes Tx1 and Tx2 may be applied to the present invention.

Figure 8A:
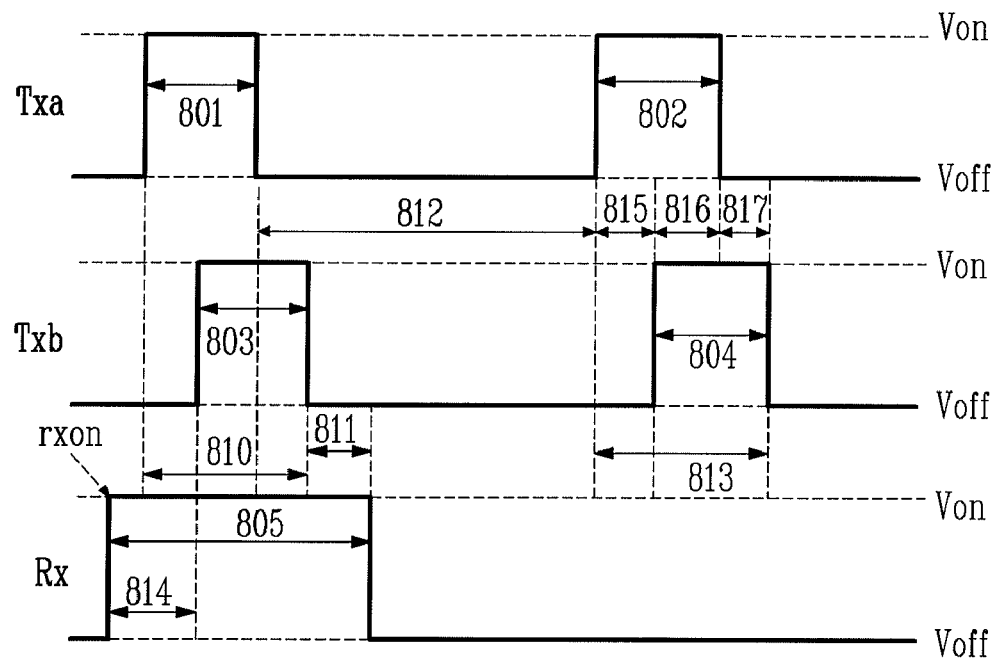
FIGS. 8A through 8C are signal waveform diagrams illustrating methods of driving a transfer transistor according to other exemplary embodiments of the present invention.

FIG. 8A is a signal waveform diagram illustrating a method of driving the transfer transistor including two transfer gate electrodes Txa and Txb and a reset transistor Rx shown in FIGS. 7A through 7B, according to a variation of the current embodiment of the present invention. Specifically, FIG. 8A illustrates the signal waveforms of the transfer gate electrodes Txa and Txb and the reset transistor Rx during reset and transfer operations of the photodiode. In FIG. 8A, reference character Von refers to a turn-on voltage applied to a gate electrode, and Voff refers to a turn-off voltage applied to the gate electrode.

In the transfer transistor including the two transfer gate electrodes Txa and Txb, a reset period 810 for sending the voltage of the photodiode to a predetermined electric potential to detect light may be understood as follows. That is, when a turn-on voltage is applied to the reset transistor Rx during a period 805 to reset the photodiode, and a turn-on voltage is applied to the transfer gate electrode Txa disposed adjacent to the photodiode during a period 801 so that the transfer gate electrode Txa is electrically isolated from the photodiode, charge is emitted from the photodiode to a channel forming region disposed under the transfer gate electrode Txa.

When the transfer gate electrode Txb is turned on, the charge accumulated under the gate insulating layer of the transfer gate electrode Txa may be redistributed and captured in a channel disposed under the gate insulating layer or transferred to the diffusion node. When turn-off voltages are applied to all the gate electrodes of the transfer transistor during a period 811, the charge transferred to the diffusion node is emitted to a circuit disposed outside a pixel through a channel of the reset transistor, so that the diffusion node is reset to a predetermined electric potential during a period 811, and a turn-off voltage is applied to the reset transistor to put the diffusion node into a floated state.

The photodiode detects light during an integration time 812 continued directly after the application of a turn-off voltage to the transfer gate electrode Txa before a period 802 in which the transfer gate electrode Txa is turned on again. Thus, the photodiode generates photocharge and accumulates the photocharge.

A period 813 for sensing the accumulated photocharge, i.e., transfer operation, is as follows. After the integration time 812, a turn-on voltage is applied to the transfer gate electrode Txa disposed adjacent to the photodiode during the period 802. Thus, when the photodiode is a complete-depletion type, all the mobile charge accumulated in the photodiode is transferred to the channel region disposed under the gate insulating layer of the transfer gate electrode Txa during a period 815, and the transfer gate electrode Txa captures signal charge in a depleted state. When the photodiode is an incomplete-depletion type, charge is emitted from the photodiode to the channel region of the transfer gate electrode Txa during the period 802 for applying a turn-on voltage to the transfer gate electrode Txa.

After the turn-on voltage is applied to the transfer gate electrode Txa, when a turn-on voltage is applied to the transfer gate electrode Txb during a period 816, the charge captured in the transfer gate electrode Txa is redistributed. After the transfer gate electrode Txb is turned on, since the transfer gate electrode Txa is switched from a turn-on voltage to a turn-off voltage during a period 817, charge captured in the channel of the transfer gate electrode Txa may be transferred to the channel of the transfer gate electrode Txb or the diffusion node. When the transfer gate electrode Txb is switched from a turn-on voltage to a turn-off voltage, all charge captured in the channel disposed under the transfer gate electrode Txb may be transferred to the diffusion node.

Also, a point in time rxon at which a turn-on voltage is applied to the reset transistor may be synchronized with a period 814, but the point in time rxon may be the same as a point in time at which a turn-on voltage is applied to the transfer gate electrode Txa to reduce a time taken for reset operation.

Figure 8B:
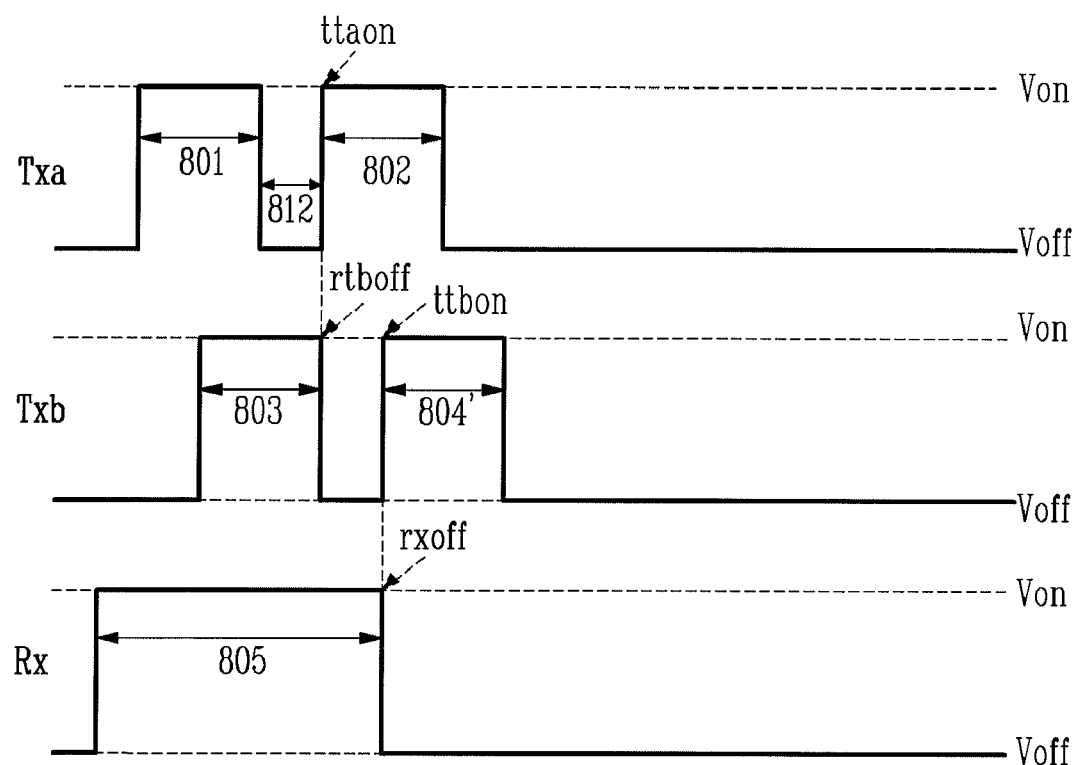

FIG. 8B is a signal waveform diagram illustrating a variation of a method of driving a transfer transistor including two transfer gate electrodes that can shorten an integration time like in the method of driving the transfer transistor including three transfer gate electrodes.

The earliest point in time at which a turn-on voltage can be applied to a transfer gate electrode Txa to transfer photocharge accumulated in a photodiode may be directly after a point in time rtboff at which a turn-off voltage is applied to the transfer gate electrode Txb to reset the photodiode. Also, the earliest point in time ttbon at which a turn-on voltage can be applied to the transfer gate electrode Txb to transfer charge from the photodiode may be directly after a point in time rxoff at which the diffusion node is reset and a turn-off voltage is applied to the reset transistor Rx. In this case, the integration time, i.e., a light condensing time, may correspond to a period 812'.

Figure 8C:
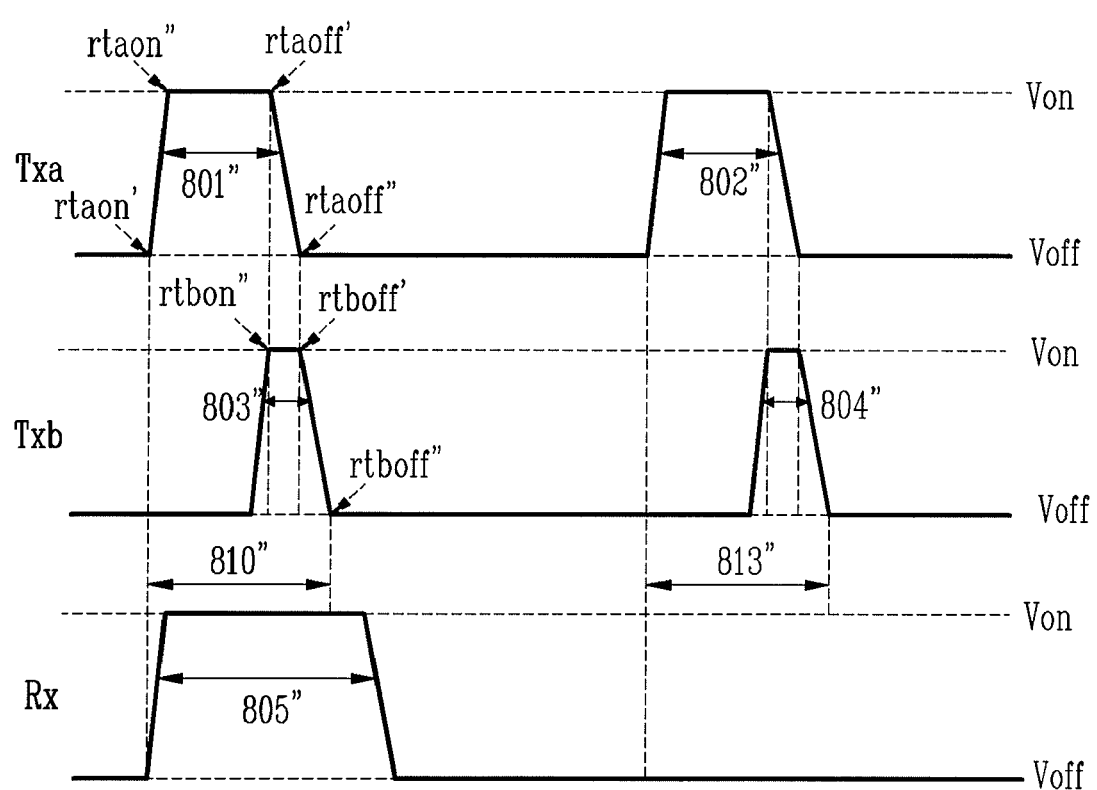

FIG. 8C is a signal waveform diagram illustrating rising and falling times of signals applied to the transfer transistor including the two gate electrodes shown in FIG. 7. A method of driving the transfer transistor as shown in FIG. 8C can reduce times consumed for reset and transfer operations of the photodiode.

Irrespective of whether the photodiode is a complete-depletion type or an incomplete-depletion type, in order to boost the pinning voltage of the photodiode and increase the electric potential at which the photodiode is reset, the amount of charge of an equilibrium channel of the transfer gate electrode Txa should be higher than the maximum amount of photocharge that can be accumulated in the photodiode, and a difference therebetween may be as great as possible within the limit that is allowed by fill factor.

In order to make the best use of a deep depletion effect, as illustrated in FIG. 8C, when the transfer gate electrode Txa is switched from a turn-off voltage to a turn-on voltage at points in time rtaon' and rtaon", a time taken to apply the turn-on voltage may include the shortest possible rising time allowed by a voltage application circuit, so that a portion disposed under the gate insulating layer can be deeply depleted.

Also, in order to effectively transfer the emitted charge, a falling time of the transfer gate electrode Txa between points in time rtaoff" and rtaoff" and a falling time of the transfer gate electrode Txb between points in time ttaoff" and ttaoff" may as long as possible if an operating time of the image sensor is not degraded. Although a reset period 810" of the photodiode is mainly described above, the foregoing driving characteristics may be similarly applied to a transfer period 813" of the photodiode.

In FIG. 8C, the influence of voltage application times 801" and 802" on the emission of charge from the photodiode may depend on whether the photodiode is a complete-depletion type or an incomplete-depletion type. In the case of a complete-depletion photodiode, when a time taken to apply a turn-on voltage to the transfer gate electrode Tx1 is longer than a predetermined time, the voltage application times 801" and 802" do not affect the electric potential of the photodiode after the reset or transfer operation. However, in the case of an incomplete-depletion photodiode, since charge is transferred from the photodiode to the channel of the gate electrode all during the period for applying the turn-on voltage, the periods 801" and 802" for applying the turn-on voltage to the transfer gate electrode Tx1 become longer during the reset and transfer periods 810" and 813".

In other words, FIG. 8C illustrates a method of driving a transfer transistor according to an exemplary embodiment of the present invention, which can minimize the entire times 810" and 813" required to reset the photodiode and transfer charge from the photodiode and maximize the time taken to apply the turn-on voltage to the transfer gate electrode Txa.

Turn-on voltages may be simultaneously applied to the reset transistor Rx and the transfer gate electrode Txa. Directly after a point in time rtbon" at which a turn-on voltage is completely applied to the transfer gate electrode Txb, the application of a turn-off voltage to the transfer gate electrode Txa may start at a point in time rtaoff". Also, directly after the point in time rtaoff" at which the turn-off voltage is completely applied to the transfer gate electrode Txa, the application of a turn-off voltage to the transfer gate electrode Txb may start at a point in time rtboff". Directly after a point in time rtboff" at which the turn-off voltage is completely applied to the transfer gate electrode Txb, a time difference between a time 805" taken to apply a turn-on voltage to the reset transistor Rx and a time 810" taken to reset the photodiode may be the minimum time required to reset the diffusion node. Although a reset period 810" of the photodiode is mainly described above, the foregoing driving characteristics may be similarly applied to a transfer period 813" of the photodiode.

In the method of driving the transfer transistor including two transfer gate electrodes according to the current embodiment, the remaining turn-on and turn-off voltages excepting the turn-on and turn-off voltages of the reset transistor Rx will now be described in detail. A turn-on voltage applied to the transfer gate electrode Txa may be the highest possible operating voltage that can be allowed by a voltage driving circuit, while a turn-on voltage applied to the transfer gate electrode Txb may be between a voltage higher than a threshold voltage determined by the thickness of the gate insulating layer and the dopant concentration of a silicon bulk disposed under the gate insulating layer and a power supply voltage.

A turn-off voltage applied to the transfer gate electrode Txa disposed adjacent to the photodiode may be a ground voltage or a negative voltage, while a turn-off voltage applied to the transfer gate electrode Txb may be a ground voltage, a negative voltage, or a voltage lower than the threshold voltage determined by the thickness and material of the gate insulating layer and the dopant concentration of the silicon bulk disposed under the gate insulating layer.

As can be known from Embodiments 1 and 2, it is clear that the transfer gate electrode Txa of the transfer transistor including two transfer gate electrodes according to Embodiment 2 has similar driving characteristics to those of the transfer gate electrode Tx1 of the transfer transistor including three transfer gate electrodes according to Embodiment 1, and the transfer gate electrode Txb of the transfer transistor including two transfer gate electrodes according to Embodiment 2 has similar driving characteristics to those of the transfer gate electrode Tx3 of the transfer transistor including three transfer gate electrodes according to Embodiment 1.

As described above, an image sensor according to the present invention can effectively suppress the occurrence of dark current, fixed pattern noise, and image lag even at a low operating voltage.

Furthermore, an image sensor according to the present invention can lessen the influence of process variables and perform constant operations, boost the pinning voltage of the photodiode when the photodiode is a complete-depletion type, and perform constant reset and transfer operations of the photodiode and reset the photodiode to a higher electric potential when the photodiode is an incomplete-depletion type. As a result, the present invention can improve the dynamic range of the image sensor and improve a signal to noise ratio.

In addition, the present invention can be embodied using conventional processes so that the conventional processes can be easily improved.

For example, when a turn-on voltage is applied to the transfer gate electrode Txb, the application of a low turn-on voltage for a predetermined time may be followed by the application of a high turn-on voltage. In other words, at least two turn-on voltages having different levels may be sequentially applied to the transfer gate electrode Txb.

As a further example, when at least two turn-on voltages having different levels are sequentially applied to the transfer gate electrode Txb, a low turn-on voltage may be lower than a voltage corresponding to a difference between a voltage of the diffusion node (when the diffusion node is taken as a source of a typical transistor) and a threshold voltage determined by the thickness and material of the gate insulating layer of the transfer gate electrode disposed closest to the diffusion node and the concentration and kind of impurities doped between a silicon bulk disposed under the gate insulating layer and the diffusion node, and a high turn-on voltage may be higher than the low turn-on voltage and lower than a power supply voltage. In this case, the application of a turn-on voltage to the transfer gate electrode Txa may be synchronized with the application of the low turn-on voltage to the transfer gate electrode Txb.

Furthermore, although the above embodiments are described using the photodiode as a light receiving device, other light receiving devices, such as a phototransistor, can be used.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of driving a transfer transistor of an image sensor comprising a light receiving device for generating photocharge and the transfer transistor for transferring the photocharge to a diffusion node and including at least two gate electrodes disposed in different positions between the light receiving device and the diffusion node, the method comprising the step of:
    applying a turn-on voltage to a gate electrode disposed close to the light receiving device earlier than at least one of the other gate electrodes
    wherein a rising time of a turn-on voltage applied to a gate electrode disposed closest to the diffusion node is different than a rising time of a turn-on voltage applied to a gate electrode disposed closest to the light receiving device.

2. The method according to claim 1, wherein the transfer transistor comprises at least three gate electrodes.

3. The method according to claim 1, wherein a turn-off voltage is applied to a gate electrode disposed closer to the light receiving device earlier than a gate electrode disposed farther from the light receiving device.

4. The method according to claim 1, wherein a turn-on voltage is applied to a gate electrode disposed closer to the light receiving device earlier than a gate electrode disposed farther from the light receiving device.

5. The method according to claim 1, wherein a turn-on voltage is simultaneously applied to the gate electrodes excepting a gate electrode disposed closest to the light receiving device.

6. The method according to claim 1, wherein a turn-on period of the gate electrode disposed closest to the light receiving device is longer than turn-on periods of the other gate electrodes.

7. The method according to claim 2, wherein a turn-on voltage is applied to a gate electrode disposed closest to the diffusion node after a turn-off voltage is completely applied to a gate electrode disposed third closest to the diffusion node,
    a turn-off voltage is applied to a gate electrode disposed second closest to the diffusion node after the turn-on voltage is applied to the gate electrode disposed closest to the diffusion node, and
    a turn-off voltage is applied to the gate electrode disposed closest to the diffusion node after the turn-off voltage is completely applied to the gate electrode disposed second closest to the diffusion node.

8. The method according to claim 1, wherein a turn-on period of one gate electrode partially overlaps a turn-on period of an adjacent gate electrode.

9. The method according to claim 1, wherein the number of the gate electrodes to which a turn-on voltage is applied is 2 or less in every point in time.

10. The method according to claim 1, wherein a rising time of a turn-on voltage applied to a gate electrode disposed closest to the diffusion node is at least twice that of a rising time of a turn-on voltage applied to a gate electrode disposed closest to the light receiving device.

11. The method according to claim 1, wherein a falling time of a turn-on voltage applied to the gate electrode disposed closest to the diffusion node is at least twice that of a rising time of a turn-on voltage applied to a gate electrode disposed closest to the light receiving device.

12. The method according to claim 1, wherein the highest turn-on voltage is applied to a gate electrode disposed closest to the light receiving device.

13. The method according to claim 1, wherein the lowest turn-on voltage is applied to a gate electrode disposed closest to the diffusion node.

14. The method according to claim 1, wherein each of the turn-off voltages applied to the gate electrodes excepting a gate electrode disposed closest to the light receiving device and a gate electrode disposed closest to the diffusion node has a level between a ground voltage and a threshold voltage of the transfer transistor.

15. The method according to claim 1, wherein the image sensor further comprises a reset transistor for resetting the light receiving device and the diffusion node,
    the transfer transistor is turned on during a transfer period for transferring the charge generated by the light receiving device and during a reset period for resetting the light receiving device and the diffusion node, and
    during the transfer period, some gate electrodes are turned on before the reset transistor is turned off and a gate electrode disposed closest to the diffusion node is turned on after the reset transistor is turned off.

16. The method according to claim 1, wherein a gate electrode disposed closest to the diffusion node is turned off after a gate electrode disposed closest to the light receiving device is completely turned off, and
    a time taken to turn on the gate electrode disposed closest to the light receiving device is longer than a time taken to turn on the gate electrode disposed closest to the diffusion node.

17. The method according to claim 1, wherein turn-on voltages having at least two levels are sequentially applied to the gate electrodes excepting a gate electrode disposed closest to the light receiving device.

18. The method according to claim 1, wherein a turn-off voltage applied to the gate electrode disposed closest to the light receiving device is at a lower level than turn-off voltages applied to the other gate electrodes.

19. A method of driving a transfer transistor of an image sensor comprising a light receiving device for generating photocharge and the transfer transistor for transferring the photocharge to a diffusion node and including at least two gate electrodes disposed in different positions between the light receiving device and the diffusion node, the method comprising the step of:

applying a turn-on voltage to a gate electrode disposed close to the light receiving device earlier than at least one of the other gate electrodes, wherein turn-on voltages having at least two levels are sequentially applied to the gate electrodes excepting a gate electrode disposed closest to the light receiving device.

20. The method according to claim 19, wherein a turn-on voltage having the lowest level applied to the gate electrodes excepting the gate electrode disposed closest to the light receiving device is simultaneously applied to some or all of the gate electrodes excepting the gate electrode disposed closest to the light receiving device.

21. The method according to claim 19, wherein turn-on voltages applied to all or some of the gate electrodes excepting the gate electrode disposed closest to the light receiving device simultaneously make the transition from a first level to a second level.

22. The method according to claim 19, wherein when a voltage applied to the gate electrode disposed closest to the light receiving device is switched from a turn-on voltage to a turn-off voltage, voltages applied to all or some of the gate electrodes excepting the gate electrode disposed closest to the light receiving device are simultaneously switched from a turn-on voltage having a first level to a turn-on voltage having a second level.

23. The method according to claim 19, wherein a turn-off voltage applied to the gate electrode disposed closest to the light receiving device is at a lower level than turn-off voltages applied to the other gate electrodes.

24. The method according to claim 19, wherein each of the turn-off voltages applied to the gate electrodes excepting a gate electrode disposed closest to the light receiving device and a gate electrode disposed closest to the diffusion node has a level between a ground voltage and a threshold voltage of the transfer transistor.

25. A method of driving a transfer transistor of an image sensor comprising a light receiving device for generating photocharge and the transfer transistor for transferring the photocharge to a diffusion node and including at least two gate electrodes disposed in different positions between the light receiving device and the diffusion node, the method comprising the step of:

applying a turn-on voltage to a gate electrode disposed close to the light receiving device earlier than at least one of the other gate electrodes, wherein a turn-off voltage applied to the gate electrode disposed closest to the light receiving device is at a lower level than turn-off voltages applied to the other gate electrodes.

26. The method according to claim 25, wherein the turn-off voltage applied to the gate electrode disposed closest to the light receiving device has a negative electric potential.

27. The method according to claim 25, wherein each of the turn-off voltages applied to the gate electrodes excepting a gate electrode disposed closest to the light receiving device and a gate electrode disposed closest to the diffusion node has a level between a ground voltage and a threshold voltage of the transfer transistor.

28. A method of driving an image sensor which includes a light receiving device for generating photocharge; a transfer transistor for transferring the photocharge to a diffusion node, and including a first gate electrode disposed on a channel region adjacent to the light receiving device and a second gate electrode disposed on the channel region adjacent to the diffusion node and electrically insulated from the first gate electrode; and a control unit for performing the method comprising:

applying a turn-on voltage to a gate electrode disposed close to the light receiving device earlier than at least one of the other gate electrodes such that a rising time of a turn-on voltage applied to a gate electrode disposed closest to the diffusion node is different than a rising time of a turn-on voltage applied to a gate electrode disposed closest to the light receiving device.

29. The method according to claim 28, wherein the width or area of the second gate electrode is smaller than the width or area of the first gate electrode.

30. The method according to claim 28, wherein the first gate electrode partially overlaps the second gate electrode.

31. The method according to claim 28, wherein at least one additional gate electrode is disposed between the first and second gate electrodes.

\* \* \* \* \*